United States Patent
Kurihara et al.

(10) Patent No.: US 8,207,653 B2
(45) Date of Patent: Jun. 26, 2012

(54) PIEZOELECTRIC GENERATING APPARATUS

(75) Inventors: Kazuaki Kurihara, Kawasaki (JP);
Shigeyoshi Umemiya, Kawasaki (JP);
Tsuyoshi Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/231,144

(22) Filed: Sep. 13, 2011

(65) Prior Publication Data

US 2012/0007470 A1 Jan. 12, 2012

Related U.S. Application Data

(63) Continuation of application No. PCT/JP2009/006346, filed on Nov. 25, 2009.

(30) Foreign Application Priority Data

Mar. 18, 2009 (JP) .................................. 2009-066085

(51) Int. Cl.
*H01L 41/04* (2006.01)
(52) U.S. Cl. ....................................................... 310/339
(58) Field of Classification Search .................... 310/339
See application file for complete search history.

(56) References Cited

U.S. PATENT DOCUMENTS

| | | | |
|---|---|---|---|
| 5,850,040 | A | 12/1998 | Okada |
| 6,098,461 | A | 8/2000 | Okada |
| 6,269,697 | B1 | 8/2001 | Okada |
| 2002/0081059 | A1 | 6/2002 | Takeuchi |
| 2005/0280334 | A1* | 12/2005 | Ott et al. .................... 310/339 |
| 2007/0035210 | A1 | 2/2007 | Sasaki |
| 2007/0145861 | A1* | 6/2007 | Tanner ......................... 310/339 |
| 2008/0100182 | A1* | 5/2008 | Chang et al. ................. 310/339 |
| 2010/0117488 | A1* | 5/2010 | Wang et al. .................. 310/339 |
| 2010/0141095 | A1* | 6/2010 | Park ............................. 310/339 |
| 2011/0057547 | A1* | 3/2011 | Fain ............................. 310/339 |

FOREIGN PATENT DOCUMENTS

| | | |
|---|---|---|
| JP | 8-94661 | 4/1996 |
| JP | 10-243667 | 9/1998 |
| JP | 11-252943 | 9/1999 |
| JP | 2003-159697 A1 | 6/2003 |
| JP | 2004-153999 A1 | 5/2004 |
| JP | 2005-318774 A1 | 11/2005 |
| JP | 2006-87285 A1 | 3/2006 |
| JP | 2007-49874 A1 | 2/2007 |

OTHER PUBLICATIONS

M. Renaud, et al.; "Piezoelectric Harvesters and MEMS Technology: Fabrication, Modeling and Measurements;" Transducers and Eurosensors '07; Proceedings of the 14th International Conference on Solid-State Sensors, Actuators and Microsystems; Lyon, France, Jun. 10-14, 2007; pp. 891-894.
International Search Report for International Application No. PCT/JP2009/006346 dated Feb. 16, 2010.

* cited by examiner

*Primary Examiner* — Thomas Dougherty
(74) *Attorney, Agent, or Firm* — Kratz, Kqintos & Hanson, LLP

(57) ABSTRACT

A piezoelectric generating apparatus includes a plurality of piezoelectric bodies arranged at intervals via a gap. Each of the plurality of piezoelectric bodies includes a fixed end and a free end. A first surface electrode is formed on one side of each of the plurality of piezoelectric bodies, and a second surface electrode is formed on an opposite side of each of the plurality of piezoelectric bodies. A weight spans the plurality of piezoelectric bodies and attached to the free ends of the plurality of piezoelectric bodies. The plurality of piezoelectric bodies are curved upon application of acceleration to the weight from the outside in a lateral direction.

17 Claims, 13 Drawing Sheets

PIEZOELECTRIC GENERATING APPARATUS

CROSS-REFERENCE TO RELATED APPLICATIONS

This application is a U.S. continuation application filed under 35 USC 111(a) claiming benefit under 35 USC 120 and 365(c) of PCT application JP2009/006346, filed on Nov. 25, 2009, the disclosure of which is hereby incorporated by reference. Further, this application is based upon and claims the benefit of priority of the prior Japanese Patent Application 2009-066085, filed on Mar. 18, 2009, the entire contents of which are incorporated herein by reference.

FIELD

The disclosures herein relate to a piezoelectric generating apparatus.

BACKGROUND

Development is underway of a sensor network including networked sensor nodes which are small integrated units of a sensor, a wireless apparatus, and a data processing function. Desirably, such sensor nodes are battery-less and capable of generating electric power on their own. Thus, adoption of an ultra-small sized system for micro-power generation is being considered that utilizes the in-situ environment, such as a solar battery system, a thermoelectric generation system, or a vibrating power generation system.

As a type of micro-power generation technology, micro-piezoelectric power generation that utilizes a piezoelectric phenomenon is known. Micro-piezoelectric power generation is a system for converting mechanical force, such as vibrations or shocks, into electric energy. The micro-piezoelectric power generation technology may be widely applied for various applications including human bodies, living organisms, and other moving objects, in addition to cars and machines.

While various types of micro-piezoelectric power generation have been studied and researched, a basic type has a unimorph structure based on a combination of a vibrating plate and a weight.

A unimorph structure is known in which a piezoelectric capacitor is mounted on a cantilever with a tip-shaped weight attached to the end of the cantilever. In this structure, stress is applied to the cantilever and the piezoelectric capacitor due to the up-down movement of the weight. The piezoelectric capacitor may have a structure including a laminate of a platinum lower electrode, a PZT film, and an aluminum upper electrode.

However, in the unimorph structure in which a piezoelectric capacitor is formed on the cantilever, the ratio of volume of the piezoelectric element to the entire volume of the piezoelectric generating apparatus is small, so that the power generating efficiency is low.

SUMMARY

According to one aspect of the invention, a piezoelectric generating apparatus includes a plurality of piezoelectric bodies arranged at intervals via a gap, each of the plurality of piezoelectric bodies having a fixed end and a free end, a first surface electrode formed on one side of each of the plurality of piezoelectric bodies, a second surface electrode formed an opposite side of each of the plurality of piezoelectric bodies, and a weight spanning the plurality of piezoelectric bodies and attached to the free end of each of the plurality of piezoelectric bodies.

The object and advantages of the disclosure will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
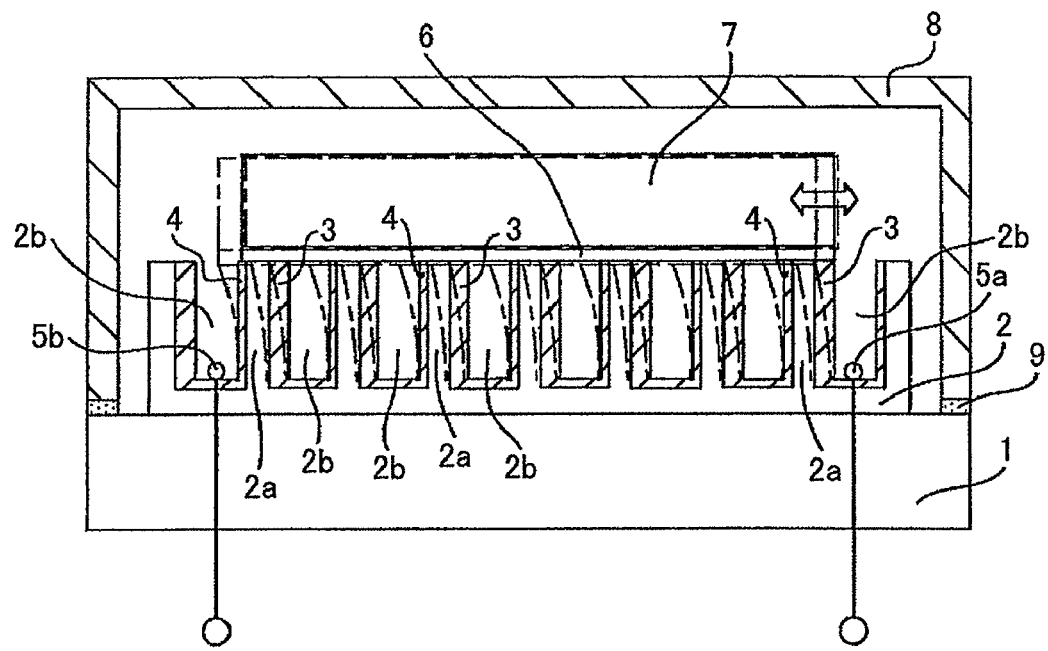
FIG. 1 is a lateral cross-section of a piezoelectric generating apparatus according to a first embodiment.

Preferred embodiments of the present invention are described with reference to the drawings, wherein like reference numerals designate identical or corresponding parts throughout the several views.

[a] First Embodiment

Figure 2:
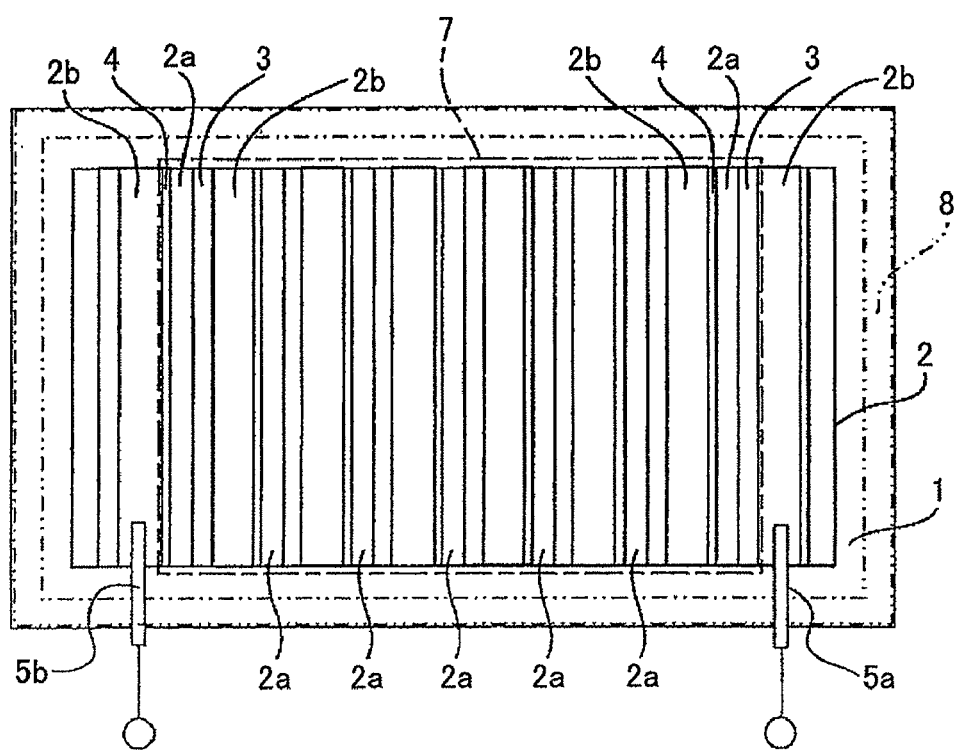
FIG. 2 is a plan view of the piezoelectric generating apparatus from which a casing has been removed according to the first embodiment.

FIG. 1 is a cross-section of a piezoelectric generating apparatus according to a first embodiment. FIG. 2 is a plan view illustrating the inside of the piezoelectric generating apparatus of FIG. 1.

In FIGS. 1 and 2, a piezoelectric substrate 2 is disposed on a substrate 1 which may be made of a high-strength material, such as alumina, stainless steel, or fiber-reinforced plastic (FRP).

In an upper part of the piezoelectric substrate 2, a plurality of plate-shaped unimorph piezoelectric cells 2a are arranged in a row at intervals via grooved gaps 2b. Each of the unimorph piezoelectric cells 2a includes a fixed end at the bottom fixed to a lower part of the piezoelectric substrate 2, i.e., a piezoelectric support portion, and has a free-end at the upper end. A surface charge appears on the plate-shaped unimorph piezoelectric cells 2a depending on the magnitude of a pressure applied to the free ends in a direction substantially parallel to a bottom surface of the piezoelectric substrate 2. The fixed ends and the free ends are relative. This also applies to the subsequent embodiments.

While FIGS. 1 and 2 illustrate seven unimorph piezoelectric cells 2a, the number of the unimorph piezoelectric cells 2a is not particularly limited.

The piezoelectric substrate 2 and the unimorph piezoelectric cells 2a are made of a piezoelectric material. Examples of the piezoelectric material include perovskite oxides, such as lead zirconate titanate (PZT; $Pb(Zr,Ti)_3$), lead lanthanum zirconate titanate (PLZT; $(Pb,La)(Zr,Ti)O_3$), niobium (Nb)-doped PZT, PNN—PZT($Pb(Ni,Nb)O_3$—$PbTiO_3$—$PbZrO_3$), PMN—PZT($Pb(Mg,Nb)O_3$—$PbTiO_3$—$PbZrO_3$), and barium titanate ($BaTiO_3$). Other materials that may be used include potassium niobate ($KNbO_3$), lithium niobate ($LiNbO_3$), lithium titanate ($LiTiO_3$), zinc oxide (ZnO), and aluminum nitride (AlN).

A first surface electrode 3 is formed on one side of each of the unimorph piezoelectric cells 2a. A second surface electrode 4 is formed on the other side of each of the unimorph piezoelectric cells 2a. The first surface electrode 3 and the second surface electrode 4 on opposite sides of the adjacent unimorph piezoelectric cells 2a are electrically connected to each other on a bottom surface of the grooved gaps 2b dividing the adjacent unimorph piezoelectric cells 2a.

Each of the unimorph piezoelectric cells 2a and the first and second surface electrodes 3 and 4 on both sides of the unimorph piezoelectric cell 2a form a generating operation portion.

The first surface electrodes 3 are formed under conditions such that the first surface electrodes 3 are less likely to be deformed by an external force than the second surface electrodes 4. In other words, the first surface electrodes 3 may be formed under conditions of film thickness and material such that the first surface electrodes 3 are less likely to deform than the second surface electrodes 4. The difficulty of deformation may be quantitatively expressed by the product $P = E \times T$, where E is the Young's modulus (modulus of elasticity in tension) of the material of the first or the second surface electrodes 3 or 4, and T is a thickness of the electrode.

When the first surface electrodes 3 and the second surface electrodes 4 are made of the same material, the first surface electrodes 3 may be made less likely to deform than the second surface electrodes 4 by forming the first surface electrodes 3 thicker than the second surface electrodes 4, as illustrated in FIG. 1.

When the Young's modulus of the material of the first surface electrodes 3 is higher than the Young's modulus of the material of the second surface electrodes 4, the first surface electrodes 3 may be made less likely to deform than the second surface electrodes 4 even when the first and second surface electrodes 3 and 4 have the same film thickness. The "thickness" of the surface electrodes formed on one and the other sides of the unimorph piezoelectric cells 2a refers to the thickness in a direction from the one side to the other side. This applies to the other embodiments described below.

Examples of the electrically conductive material that may be used for the first surface electrodes 3 and the second surface electrodes 4 include metals such as nickel (Ni), platinum (Pt), iridium (Ir), chromium (Cr), copper (Cu), and titanium (Ti), nitrides such as titanium nitride (TiN), carbides such as tungsten carbide (WC), and oxides such as indium tin oxide (ITO).

The first and second surface electrodes 3 and 4 may have a laminated structure of two or more layers. In this case, the aforementioned electrically conductive material may be used in the layer in contact with the sides of the unimorph piezoelectric cells 2a.

First and second wires 5a and 5b are connected to the first and second surface electrodes 3 and 4, respectively, on the outer-most ends of the piezoelectric substrate 2. The first and second wires 5a and 5b may be connected to the respective electrodes by soldering or wire bonding.

On top of the free ends of the unimorph piezoelectric cells 2a, a weight 7 is attached via an adhesive layer 6. The weight 7 may include a solid body extending over or spanning the free ends of the unimorph piezoelectric cells 2a, as illustrated in FIGS. 1 and 2. Preferably, the weight 7 may be divided into a plurality of portions.

Preferably, the weight 7 is made of a material having high specific gravity and Young's modulus. Examples of the material include metals such as stainless steel, tungsten, and lead, and ceramics such as zirconia. Preferably, the weight 7 may be made of a piezoelectric material.

Preferably, the adhesive layer 6 includes a material capable of preventing the peeling of the weight 7 from the unimorph piezoelectric cells 2a upon deformation of the unimorph piezoelectric cells 2a due to movement of the weight 7 to which acceleration is applied. For example, the adhesive layer 6 is made of an adhesive material having a Young's modulus smaller than that of the unimorph piezoelectric cells 2a and having an excellent adhesive property, such as a silicone elastic resin.

A casing 8 is attached onto the substrate 1. The casing 8 houses the piezoelectric substrate 2, the unimorph piezoelectric cells 2a, and the weight 7, and has an internal space of a size allowing a displacement of the unimorph piezoelectric cells 2a and the weight 7. The rim of a lower opening portion of the casing 8 may be bonded to a peripheral edge portion of an upper surface of the substrate 1 via a sealant 9, such as an epoxy resin sealant. The casing 8 is made of a material capable of protecting the unimorph piezoelectric cells 2a and the weight 7, such as stainless steel, aluminum, or a resin.

Between the casing 8 and the substrate 1, there may be formed a gap for passing the wires 5a and 5b connected to the first and second surface electrodes 3 and 4, respectively. The gap may be hermetically sealed with the sealant 9.

The space enclosed by the casing 8 and the substrate 1 may be filled with air. Preferably, the space may be filled with an inert gas such as nitrogen, or decompressed.

In the piezoelectric generating apparatus, when the weight 7 is moved as indicated by arrows in FIG. 1, the unimorph piezoelectric cells 2a are curved in the same direction. In this case, because the product P of the Young's modulus E and the film thickness T for the first surface electrodes 3 is larger than that for the second surface electrodes 4, the amount of expansion and contraction of the other side of the unimorph piezoelectric cells 2a becomes larger than that of the one side as the curvature increases. As a result, strain is produced within the unimorph piezoelectric cells 2a, and a potential difference corresponding to the magnitude of pressure is caused between the first surface electrodes 3 and the second surface electrodes 4 due to a lateral piezoelectric effect (d31 effect).

The first surface electrodes 3 and the second surface electrodes 4 disposed opposite to each other via the gaps 2b are connected on the bottom surfaces of the gaps 2b. Thus, the unimorph piezoelectric cells 2a are connected in series via the first and second surface electrodes 3 and 4. Thus, the unimorph piezoelectric cells 2a on top of the piezoelectric substrate 2 are electrically connected in series, and the potential differences generated across the sides of the cells are added up, the number of the potential differences corresponding to the number of the unimorph piezoelectric cells 2a. As a result, a large potential difference is caused between the first and second surface electrodes 5a and 5b.

Because the adhesive layer 6 by which the unimorph piezoelectric cells 2a are bonded to the weight 7 is made of a material having a Young's modulus smaller than that of the weight 7, the movement of the weight 7 is not hindered by the adhesive layer 6.

Next, a method of forming the piezoelectric generating apparatus is described.

Figure 3A:
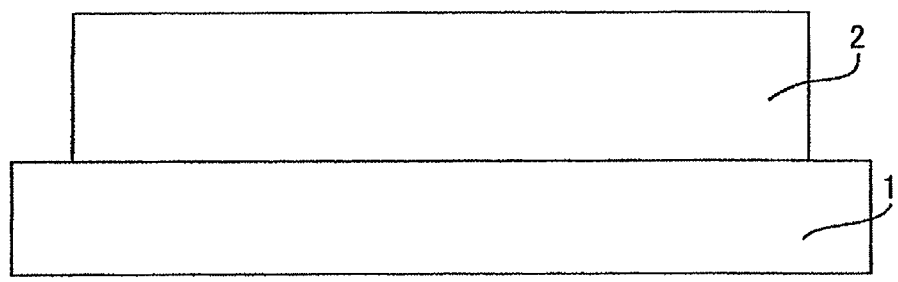
FIGS. 3A through 3G are cross-sections illustrating steps of forming the piezoelectric generating apparatus according to the first embodiment.

First, as illustrated in FIG. 3A, the piezoelectric substrate 2 is formed on the substrate 1, which may be made of silicon. For forming the piezoelectric substrate 2, a PZT film may be formed to a thickness of 25 μm by CVD, and then the PZT film may be patterned by photolithography to have a substrate length of about 5 mm and a substrate width of about 3 mm. The Young's modulus of the PZT film may be about 65 GPa.

The method of forming the piezoelectric substrate 2 is not limited to CVD and may also include sputtering, a sol-gel process, pulsed laser deposition, MOCVD, thick-film printing, a green sheet laminating process, or aerosol deposition. Preferably, a piezoelectric plate may be bonded to the substrate 1. The piezoelectric substrate 2 formed by the green sheet laminating process may include a sintered body.

Figure 3B:
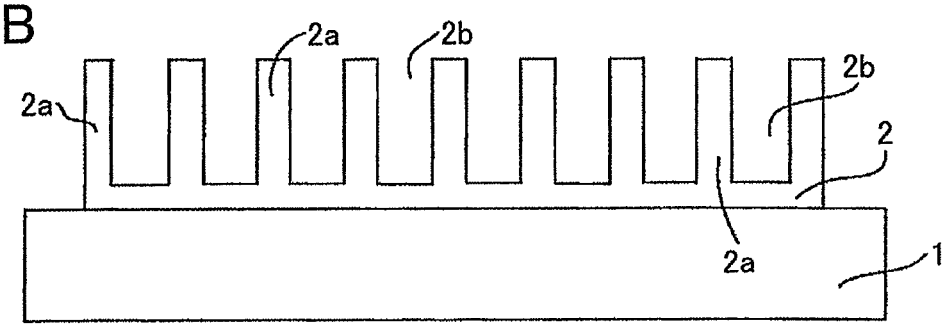

Thereafter, as illustrated in FIG. 3B, grooves are formed in an upper part of the piezoelectric substrate 2 by using a dicing saw, forming the gaps 2b. As a result, the plate-shaped unimorph piezoelectric cells 2a divided by the gaps 2b are formed. The method of forming the gaps 2b is not limited to using the dicing saw and may include milling or reactive ion etching with the use of a mask.

The depth of the gaps 2b may be about 20 μm. The width of the gaps 2b in a lateral direction of FIG. 3B may be about 10 μm or less. In this way, a concave-convex pattern with a pitch of 30 μm may be formed on top of the piezoelectric substrate 2.

Figure 3C:
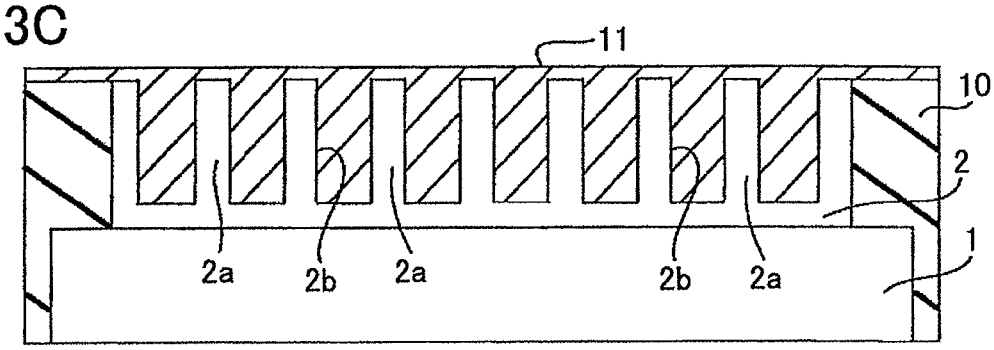

Then, as illustrated in FIG. 3C, the piezoelectric substrate 2 is fitted in a frame 10 such that the piezoelectric substrate 2 is surrounded by the frame 10. A first conductive film 11 is then formed over the unimorph piezoelectric cells 2a and within the gaps 2b by electroless plating. The first conductive film 11 may include a nickel film having a Young's modulus of about 220 GPa. The first surface electrode film 11 is formed to a thickness such that the gaps 2b can be completely filled. Thereafter, an upper surface of the first conductive film 11 may be planarized by chemical mechanical polishing (CMP).

Figure 3D:
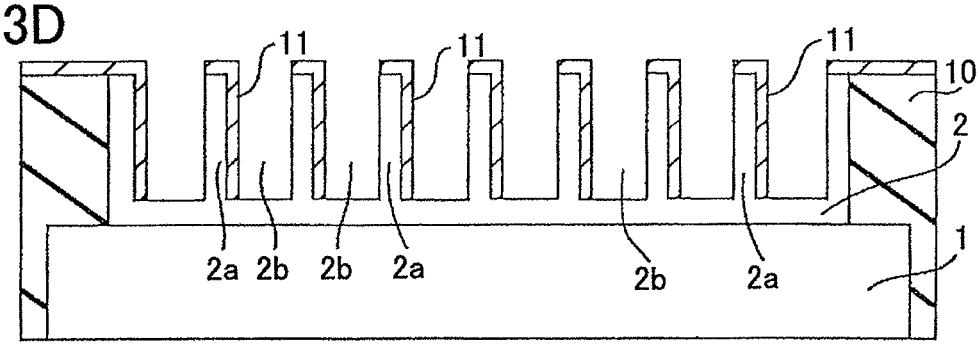

Then, as illustrated in FIG. 3D, the gaps 2b are again exposed in the first conductive film 11 by placing the dicing saw in the unimorph piezoelectric cells 2a and the gaps 2b. The first conductive film 11 may be left to a thickness of about 5 μm on one side of the unimorph piezoelectric cells 2a while exposing the other side of the unimorph piezoelectric cells 2a. In this case, the gaps 2b may be 15 μm in the lateral direction, and the thickness of the unimorph piezoelectric cells 2a in the lateral direction of the drawings may be about 10 μm.

Figure 3E:
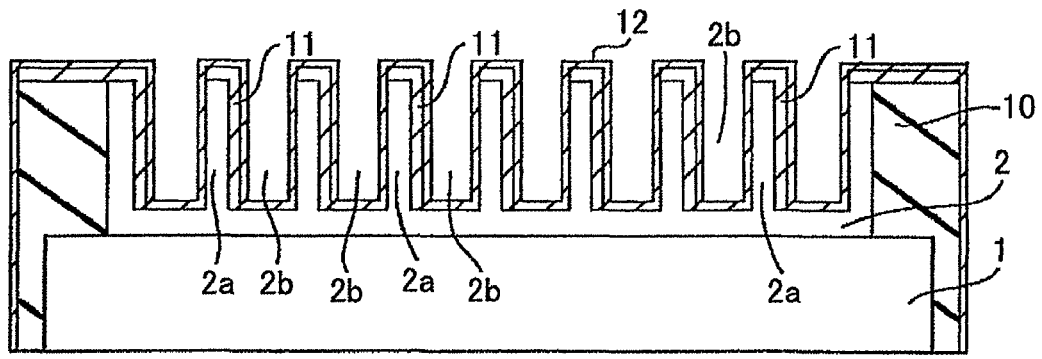

Next, as illustrated in FIG. 3E, a second conductive film 12 is formed on the exposed surfaces of the unimorph piezoelectric cells 2a and the first conductive film 11. The second conductive film 12 may include a nickel film having a Young's modulus of about 50 GPa which may be formed by DC sputtering. The second conductive film 12 may be formed to a thickness of 0.1 μm on both sides of the unimorph piezoelectric cells 2a.

The first and second conductive films 11 and 12 formed on one side of the unimorph piezoelectric cells 2a are used as the first surface electrodes 3, and the second conductive film 12 formed on the other side is used as the second surface electrodes 4. The first surface electrodes 3 and the second surface electrodes 4 exposed in the gaps 2b are electrically connected on the bottom surfaces of the gaps 2b.

The method of forming the first and second conductive films 11 and 12 is not limited to the above method and may also include plating methods such as electrolytic plating and electroless plating, physical vapor deposition (PVD) such as sputtering, or chemical vapor deposition (CVD) such as organic metal chemical vapor deposition (MO-CVD).

Particularly, it is preferable to form the first conductive film 11 by an electroless plating method as described above from the viewpoint of cost and speed of film formation. Preferably, the second conductive film 12 may be formed by sputtering in order to reduce the difficulty of deformation compared to that of the first conductive film 11. The material of the first and second conductive films 11 and 12 may include tantalum, titanium, and other metals or alloys.

Figure 3F:
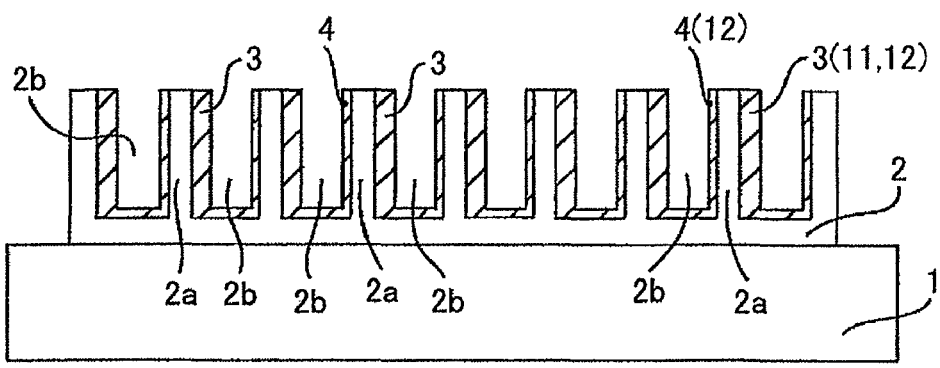

Thereafter, as illustrated in FIG. 3F, the first and second conductive films 11 and 12 on the free ends of the unimorph piezoelectric cells 2a are removed by polishing. Thus, the first conductive film 11 on one side of the unimorph piezoelectric cells 2a is separated from the second conductive film 12 on the other side at the free ends of the unimorph piezoelectric cells 2a.

In this process, the polishing method is not particularly limited and may include chemical mechanical polishing (CMP).

In order to prevent damage to the convex unimorph piezoelectric cells 2a, the gaps 2b may be filled with a resin prior to polishing, and the resin may be removed after polishing by using a solvent.

Figure 3G:
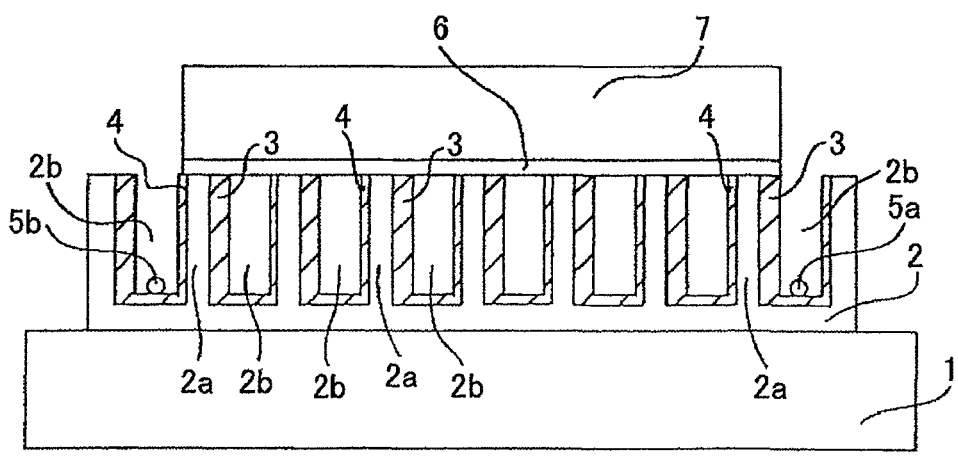

Then, as illustrated in FIG. 3G, the weight 7 having a thickness of about 30 μm and made of stainless steel, for example, is prepared and placed on the free ends of the unimorph piezoelectric cells 2a via the adhesive layer 6.

Thereafter, the casing 8 having a cubic outer shape is bonded and fixed onto the peripheral edge portion of the substrate 1 via the epoxy sealant 9, as illustrated in FIG. 1.

An acceleration test was conducted by vibrating the piezoelectric generating apparatus formed as described above in a lateral direction at the frequency of 1 kHz using a vibrator. When the number of the plate-shaped unimorph piezoelectric cells 2a in the piezoelectric generating apparatus is 100, a high output of about 500 μW can be obtained via the first and second wires 5a and 5b.

Figure 4:
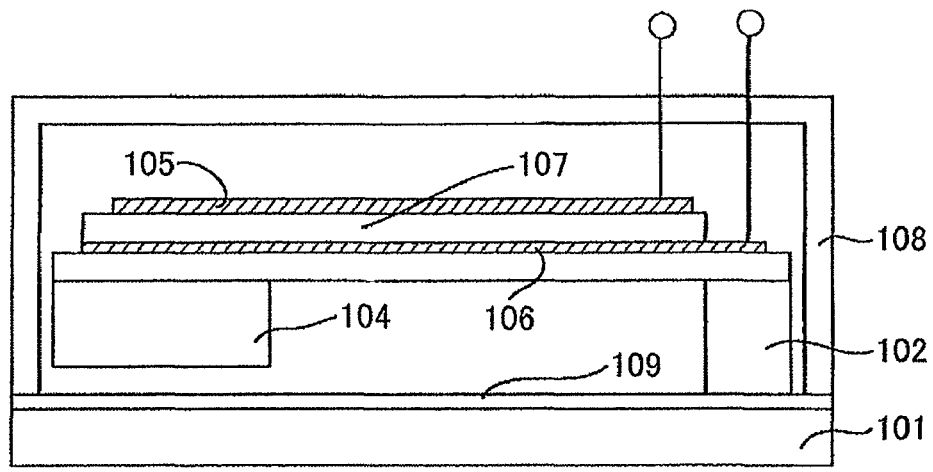
FIG. 4 is a lateral cross-section of a piezoelectric generating apparatus according to a comparative example.

On the other hand, in a piezoelectric generating apparatus according to the related art as illustrated in FIG. 4, when the vibrating frequency in the up-down direction is 1 kHz, a low output of about 40 μW is obtained.

The piezoelectric generating apparatus of FIG. 4 has a structure in which a weight 104 is attached to the bottom of the free end of a vibrating plate 103 supported on a support portion 102 on a substrate 101 in a cantilever fashion.

On top of the vibrating plate 103, a plate-shaped PZT piezoelectric body 107 is disposed between an upper electrode 105 and a lower electrode 106. The size of the PZT piezoelectric body 107 is the same as the size of one of the unimorph piezoelectric cells 2a on the above-described piezoelectric substrate 2. The upper electrode 105 is formed of a nickel film and has a thickness of about 0.1 μm.

The support portion 102, the vibrating plate 103, the weight 104, and the PZT piezoelectric body 107 and the like are covered with a casing 108. The casing 108 and the support portion 102 are bonded and fixed onto the substrate 101 via an adhesive layer 109.

[b] Second Embodiment

Figure 5:
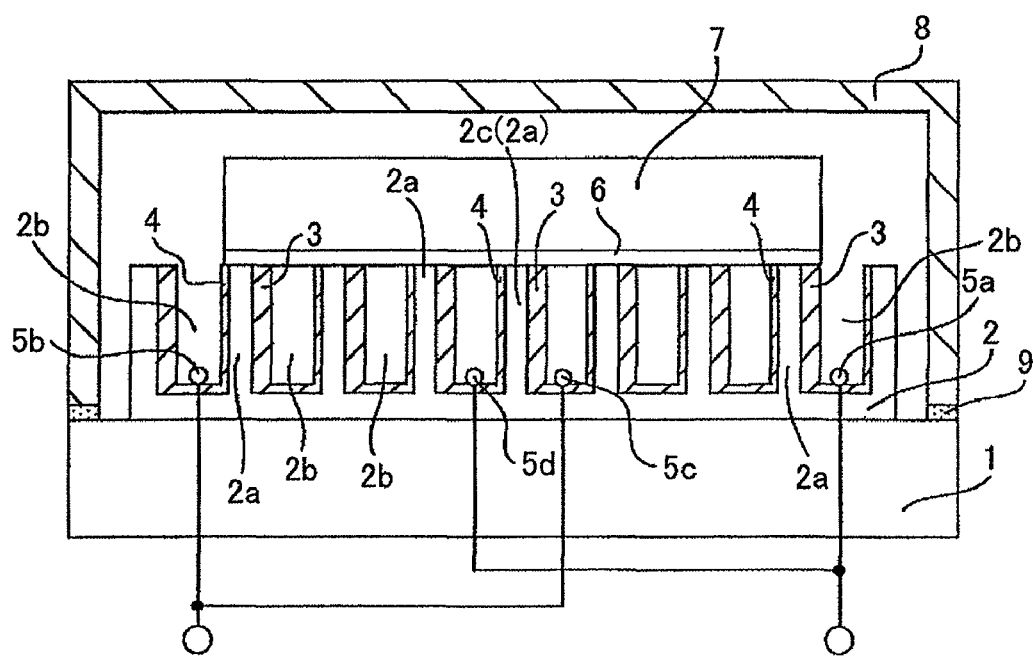
FIG. 5 is a lateral cross-section of a piezoelectric generating apparatus according to a second embodiment.

FIG. 5 is a cross-section of a piezoelectric generating apparatus according to a second embodiment. In FIG. 5, as in the first embodiment, the piezoelectric substrate 2 having a plurality of the unimorph piezoelectric cells 2a arranged at intervals via the grooved gaps 2b are mounted on the substrate 1. Further, as in the first embodiment, the first surface electrodes 3 are formed on one side of the unimorph piezoelectric cells 2a, and the second surface electrodes 4 are formed on the other side. Further, the weight 7 is placed on the free ends of the unimorph piezoelectric cells 2a via the adhesive layer 6. In this case, too, the lower portion of the piezoelectric substrate 2 provides the piezoelectric support portion for the unimorph piezoelectric cells 2a.

One of the unimorph piezoelectric cells 2a that is located at or close to the center functions as an insulating portion 2c. A third wire 5c is connected to the first surface electrode 3 on one side of the insulating portion 2c. The third wire 5c is electrically connected to the second wire 5b. Further, a fourth wire 5d is connected to the second surface electrode 4 on the other side of the insulating portion 2c. The fourth wire 5d is connected to the first wire 5a.

Thus, the unimorph piezoelectric cells 2a to the right of the insulating portion 2c in FIG. 5 are electrically connected in series between the first wire 5a and the third wire 5c. The unimorph piezoelectric cells 2a to the left of the insulating portion 2c in the drawing are electrically connected in series between the second wire 5b and the fourth wire 5d.

The right-hand side group of the unimorph piezoelectric cells 2a with respect to the insulating portion 2c in FIG. 5 is drawn out by the first wire 5a and the third wire 5c. The left-hand side group of the unimorph piezoelectric cells 2a with respect to the insulating portion 2c in FIG. 5 is drawn out by the second wire 5b and the fourth wire 5d. The two groups are electrically connected in parallel. Thus, the internal impedance between the first and second wires 5a and 5b is one half that of the piezoelectric generating apparatus according to the first embodiment.

When the weight 7 of the piezoelectric generating apparatus according to the present embodiment is moved in the lateral direction by applying acceleration, a potential difference is caused between the first and second surface electrodes 3 and 4 by the lateral piezoelectric effect. For example, when the weight 7 is vibrated by using a vibrator in a shaking test, an output of about 500 μW is generated by the 100 unimorph piezoelectric cells 2a at the vibrating frequency of 1 kHz.

While the unimorph piezoelectric cells 2a are divided into two groups by the insulating portion 2c in accordance with the present embodiment, the unimorph piezoelectric cells 2a may be divided into three or more groups to form a plurality of electrode pairs.

[c] Third Embodiment

Figure 6:
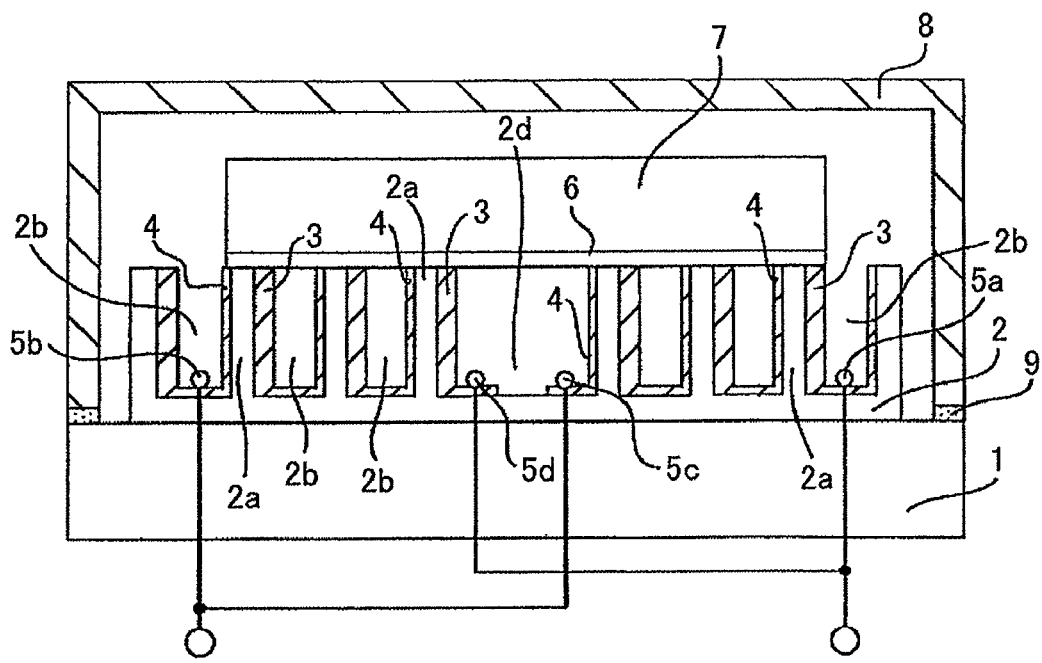
FIG. 6 is a lateral cross-section of a piezoelectric generating apparatus according to a third embodiment.

FIG. 6 is a cross-section of a piezoelectric generating apparatus according to a third embodiment. In FIG. 6, as in the first embodiment, the piezoelectric substrate 2 having the unimorph piezoelectric cells 2a arranged at intervals via grooved gaps 2b and 2d is mounted on the substrate 1. Further, as in the first embodiment, the first surface electrodes 3 are formed on one side of the unimorph piezoelectric cells 2a, and the second surface electrodes 4 are formed on the other side. Further, the weight 7 is placed on the free ends of the unimorph piezoelectric cells 2a via the adhesive layer 6. In this case, too, the lower portion of the piezoelectric substrate 2 provides the piezoelectric support portion for the unimorph piezoelectric cells 2a.

The unimorph piezoelectric cells 2a are divided into two groups by a second gap 2d formed at the center and having a larger width. The second gap 2d may have a width of about 50 μm in a lateral direction of FIG. 6. At the bottom of the gap 2d, the first and second surface electrodes 3 and 4 on either side are separated from each other. The first surface electrode 3 on the extreme right-hand side one of the unimorph piezoelectric cells 2a to the right of the wide gap 2d is connected to the first wire 5a. The second surface electrode 4 on the extreme left-hand side one of the unimorph piezoelectric cells 2a to the right of the gap 2d is connected to the third wire 5c.

The second electrode 4 on the extreme left-hand side one of the unimorph piezoelectric cells 2a to the left of the second gap 2d is connected to the second wire 5b. The first surface electrode 3 on the extreme right-hand side one of the unimorph piezoelectric cells 2a to the left of the second gap 2d is connected to the fourth wire 5d.

Thus, the unimorph piezoelectric cells 2a of the right-hand side group with respect to the wide second gap 2d are connected in series between the first wire 5a and the third wire 5c. The unimorph piezoelectric cells 2a of the left-hand side group with respect to the second gap 2d are connected in series between the second wire 5b and the fourth wire 5d.

Thus, the group of the unimorph piezoelectric cells 2a to the right of the wide gap 2d is drawn out by the first wire 5a and the third wire 5c. The group of the unimorph piezoelectric cells 2a to the left of the gap 2d is drawn out by the second wire 5b and the fourth wire 5d. The first wire 5a is connected to the fourth wire 5d, while the second wire 5b is connected to the third wire 5c.

Thus, the right-hand side group of the unimorph piezoelectric cells 2a and the left-hand side group of the unimorph piezoelectric cells 2a are electrically connected in parallel. The internal impedance between the first and second wires 5a and 5b is one half of that of a piezoelectric generating apparatus having the same number of the unimorph piezoelectric cells 2a as that of the first embodiment.

When the weight 7 of the piezoelectric generating apparatus according to the present embodiment is vibrated in the lateral direction by applying acceleration, a potential difference is caused between the first and second surface electrodes 3 and 4 due to the lateral piezoelectric effect.

For example, when the weight 7 is vibrated using a vibrator in a shaking test, an output of about 500 μW can be obtained at the vibrating frequency of 1 kHz from the 100 unimorph piezoelectric cells 2a.

While the unimorph piezoelectric cells 2a are divided into two groups by the wide second gap 2d in accordance with the present embodiment, the unimorph piezoelectric cells 2a may be divided into three or more groups by the wide second gap 2d in order to provide a plurality of electrode pairs. Preferably, instead of forming the wide second gap 2d, the unimorph piezoelectric cells 2a may be divided into a plurality of groups by dividing the first and second surface electrodes 3 and 4 via an inner surface of the gaps 2b.

[d] Fourth Embodiment

Figure 7:
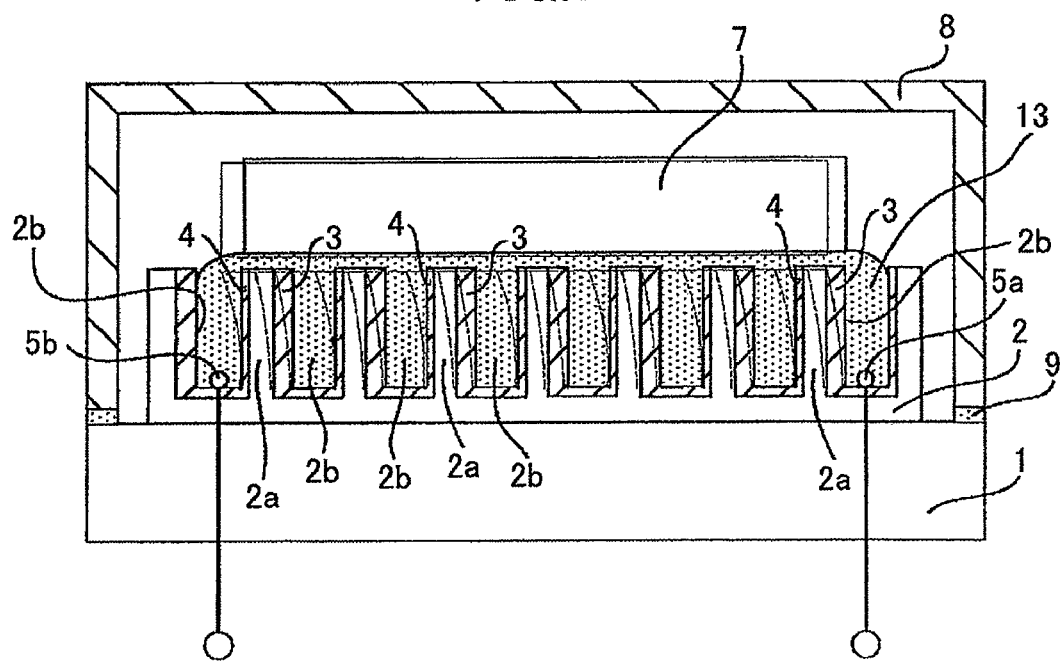
FIG. 7 is a lateral cross-section of a piezoelectric generating apparatus according to a fourth embodiment.

FIG. 7 is a cross-section of a piezoelectric generating apparatus according to a fourth embodiment.

In FIG. 7, as in the first embodiment, the piezoelectric substrate 2 having the unimorph piezoelectric cells 2a arranged at intervals via the grooved gaps 2b is formed on the substrate 1. Further, as in the first embodiment, the first surface electrodes 3 are formed on one side of the unimorph piezoelectric cells 2a while the second surface electrodes 4 are formed on the other side.

The grooved gaps 2b that divide the unimorph piezoelectric cells 2a are filled with an elastic material 13 having an adhesive property. The elastic material 13 is also formed on the free ends of the unimorph piezoelectric cells 2a such that the unimorph piezoelectric cells 2a and the weight 7 can be bonded to each other. The elastic material 13 may be made of an insulating material having a Young's modulus smaller than that of the material of the unimorph piezoelectric cells 2a, such as a silicone resin.

The elastic material 13 may be formed after the first and second surface electrodes 3 and 4 have been formed, as illustrated in FIG. 3F for the first embodiment. For example, the gaps 2b are filled with the elastic material 13 and the elastic material 13 is also formed over the free ends of the unimorph piezoelectric cells 2a. Thereafter, the weight 7 is placed on the elastic material 13 covering the free ends of the unimorph piezoelectric cells 2a, and then the elastic material 13 is cured by heating. Thus, the weight 7 is bonded to the free ends of the piezoelectric cells 2a via the elastic material 13.

In this case, too, the lower part of the piezoelectric substrate 2 provides the piezoelectric support portion for the unimorph piezoelectric cells 2a.

Thereafter, the casing 8 is bonded onto the substrate 1 using the adhesive 9, as in the first embodiment.

Thus, in accordance with the present embodiment, when acceleration is applied to the weight 7, the weight 7 is displaced, thereby deforming the unimorph piezoelectric cells 2a underneath. As a result, potential differences are caused between the first surface electrodes 3 and the second surface electrodes 4 due to the lateral piezoelectric effect, thus generating power as in the first embodiment. In this case, the elastic material 13 is deformed by the movement of the weight 7 and the unimorph piezoelectric cells 2a.

The elastic material 13 may prevent excessive deformation of the unimorph piezoelectric cells 2a and make it easier for the unimorph piezoelectric cells 2a that have been curved to return to their original position.

When the weight 7 of the piezoelectric generating apparatus was vibrated by a vibrator in a shaking test, an output of 800 μW was obtained at the vibrating frequency of 1 kHz.

Alternatively, after the second conductive film 12 is formed as illustrated in FIG. 3E, the gaps 2b may be filled with the elastic material 13 to a depth such that the free ends of the unimorph piezoelectric cells 2a are not covered. In this way, when the first and second conductive films 11 and 12 on the free ends of the unimorph piezoelectric cells 2a are CMPed as illustrated in FIG. 3F, deformation of the unimorph piezoelectric cells 2a may be restrained by the elastic material 13. As a result, removal of the top portions of the first and second conductive films 11 and 12 may be made easier. The free ends of the unimorph piezoelectric cells 2a and the weight 7 are connected via the adhesive layer 6, as in the first embodiment.

[e] Fifth Embodiment

Figure 8:
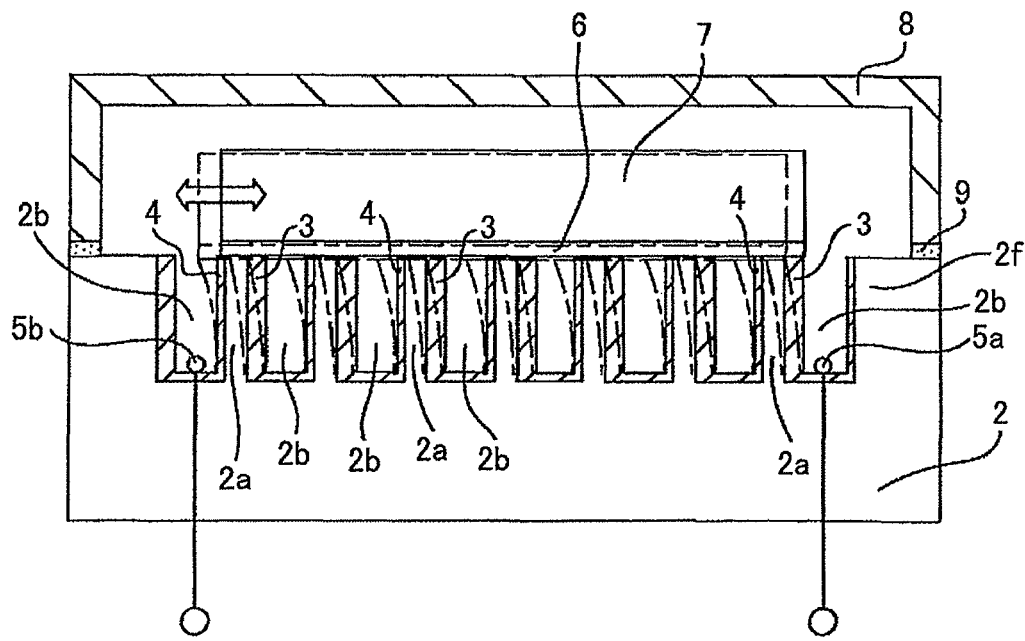
FIG. 8 is a lateral cross-section of a piezoelectric generating apparatus according to a fifth embodiment.

FIG. 8 is a cross-section of a piezoelectric generating apparatus according to a fifth embodiment.

In FIG. 8, the lower part of the piezoelectric substrate 2 that supports the unimorph piezoelectric cells 2a, i.e., the piezoelectric support portion, has a thickness of several millimeters or more and provides the function of the substrate 1 according to the first embodiment.

The plate-shaped unimorph piezoelectric cells 2a are arranged at intervals via the grooved gaps 2b in an area of an upper part of the piezoelectric substrate 2 other than peripheral edge portions 2f, as in the first embodiment. The unimorph piezoelectric cells 2a and the grooved gaps 2b may have the same sizes as those of the first embodiment. The peripheral edge portions 2f of the piezoelectric substrate 2 are formed with an interval from the unimorph piezoelectric cells 2a on either end and with the same height as that of the unimorph piezoelectric cells 2a.

The first surface electrodes 3 are formed on one side of the unimorph piezoelectric cells 2a, and the second surface electrodes 4 are formed on the other side. The relationship between the Young's modulus and the thickness of the first surface electrodes 3 or the second surface electrodes 4 may be the same as that of the first embodiment. The first surface electrodes 3 and the second surface electrodes 4 that are disposed opposite to each other via the gaps 2b are electrically connected on bottom surfaces of the gaps 2b.

The first surface electrode 3 and the second surface electrode 4 on the outer-most ends of the piezoelectric substrate 2 are connected to the first wire 5a and the second wire 5b, respectively.

As in the first embodiment, the weight 7 is attached onto the free ends of the unimorph piezoelectric cells 2a via the adhesive layer 6.

The casing 8 is attached to the peripheral edge portions 2f of the piezoelectric substrate 2 via the sealant 9. The casing 8 has an internal space of a size allowing a displacement of the piezoelectric substrate 2 and the weight 7.

The space defined by the casing 8 and the piezoelectric substrate 2 may be filled with air. Preferably, the space may be filled with an inert gas such as nitrogen, or decompressed.

In the piezoelectric generating apparatus, when the weight 7 is moved in the lateral direction indicated by arrows in FIG. 8 by applying acceleration, the unimorph piezoelectric cells 2a are curved in the same direction. In this case, because the product P of the Young's modulus E and the film thickness T is greater for the first surface electrodes 3 than for the second surface electrodes 4, strain is caused in the unimorph piezoelectric cells 2a. As a result, a potential difference corresponding to pressure is generated between the first surface electrodes 3 and the second surface electrodes 4 due to the lateral piezoelectric effect.

Further, because the piezoelectric substrate 2 also provides the function of the substrate 1, the substrate 1 illustrated in FIG. 1 can be eliminated, thus enabling a decrease in the number of components.

[f] Sixth Embodiment

Figure 9:
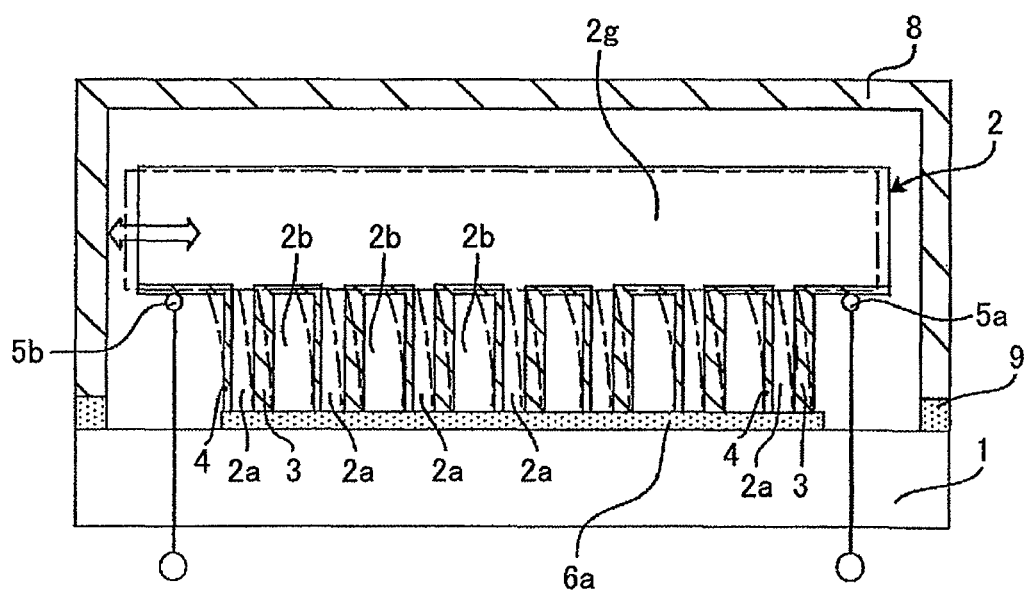
FIG. 9 is a lateral cross-section of a piezoelectric generating apparatus according to a sixth embodiment.

FIG. 9 is a cross-section of a piezoelectric generating apparatus according to a sixth embodiment.

In FIG. 9, the piezoelectric substrate 2 is disposed on the substrate 1 which is made of a material having a high strength, such as silicon, ceramics, alumina, stainless steel, or a resin such as FRP. The piezoelectric substrate 2 may be made of a piezoelectric material according to the first embodiment.

Under the piezoelectric substrate 2, the plate-shaped unimorph piezoelectric cells 2a arranged at intervals via the grooved gaps 2b are formed. The unimorph piezoelectric cells 2a may be formed by forming the gaps 2b in the piezoelectric substrate 2 by the same method used for the first embodiment. A block of the piezoelectric substrate 2 that is formed integrally on the free ends of the unimorph piezoelectric cells 2a provides a weight portion 2g. The block may have a thickness of several millimeters. Because the piezoelectric material such as PZT has a large specific gravity, the block may provide the same function as that of the weight 7 according to the first embodiment.

The other ends of the unimorph piezoelectric cells 2a are bonded to the substrate 1 via the adhesive layer 6a, thus forming fixed ends. When the weight portion 2g of the piezoelectric substrate 2 is moved in the lateral direction, the unimorph piezoelectric cells 2a are curved, and surface charges are generated on both sides of the unimorph piezoelectric cells 2a. In this case, the substrate 1 provides the support portion for the unimorph piezoelectric cells 2a. While FIG. 9 illustrates seven unimorph piezoelectric cells 2a, the number of the unimorph piezoelectric cells 2a is not particularly limited.

Preferably, the adhesive layer 6a is made of a material capable of preventing the peeling of the unimorph piezoelectric cells 2a from the substrate 1 upon deformation of the unimorph piezoelectric cells 2a. Preferably, the adhesive layer 6a is made of an adhesive material having a Young's modulus smaller than that of the unimorph piezoelectric cells 2a and excellent adhesive property, such as a silicone elastic resin.

As in the first embodiment, the first surface electrodes 3 are formed on one side of the unimorph piezoelectric cells 2a while the second surface electrodes 4 are formed on the other side. The first surface electrodes 3 and the second surface electrodes 4 opposite each other via the gaps 2b are electrically connected on upper-end surfaces of the gaps 2b.

The first surface electrodes 3 are formed under conditions such that it is more difficult to deform the first surface electrodes 3 than the second surface electrodes 4 by an external force, as in the first embodiment. In other words, the first surface electrodes 3 may have a film thickness or include a material such that the first surface electrodes 3 are more difficult to deform than the second surface electrodes 4. The difficulty of deformation may be quantitatively expressed by the product $P = E \times T$, where E is the Young's modulus of the material of the first or the second surface electrodes 3 or 4, and T is a thickness of the electrode.

Examples of the electrically conductive material that may be used in the first surface electrodes 3 and the second surface electrodes 4 include those described for the first embodiment.

The first surface electrode 3 and the second surface electrode 4 on the extreme ends of the piezoelectric substrate are connected to the first and second wires 5a and 5b, respectively. The substrate 1 is covered with the casing 8 via the sealant 9 as in the first embodiment, the casing 8 having an internal space of a size such that the displacement of the piezoelectric substrate 2 is not limited.

In the piezoelectric generating apparatus, when the weight portion 2g of the piezoelectric substrate 2 is moved in the lateral direction indicated by arrows in FIG. 9, the unimorph piezoelectric cells 2a are curved in the same direction. As a result, a potential difference corresponding to pressure is caused between the first surface electrodes 3 and the second surface electrodes 4 by the lateral piezoelectric effect.

Further, because the first surface electrodes 3 and the second surface electrodes 4 opposite each other via the gaps 2b are connected on the ceiling surfaces of the gaps 2b, the unimorph piezoelectric cells 2a are connected in series via the first and second surface electrodes 3 and 4. Thus, the potential differences caused across the sides of the unimorph piezoelectric cells 2a are added up, resulting in a large potential difference between the first and second surface electrodes 3 and 4 on either end.

Because the adhesive layer 6a by which the unimorph piezoelectric cells 2a are bonded to the substrate 1 is made of a material having a Young's modulus smaller than that of the unimorph piezoelectric cells 2a, the movement of the weight portion 2g is not blocked by the adhesive layer 6a. Further, in accordance with the present embodiment, the need for the weight 7 of the first embodiment is eliminated, so the number of components can be reduced.

As in the fourth embodiment, at least a part of the space between the piezoelectric generating portions (which are formed by the unimorph piezoelectric cells 2a, the first electrodes 3, and the second electrodes 4) and the substrate 1 may be filled with a material having a Young's modulus smaller than that of the unimorph piezoelectric cells 2a.

[g] Seventh Embodiment

Figure 10:
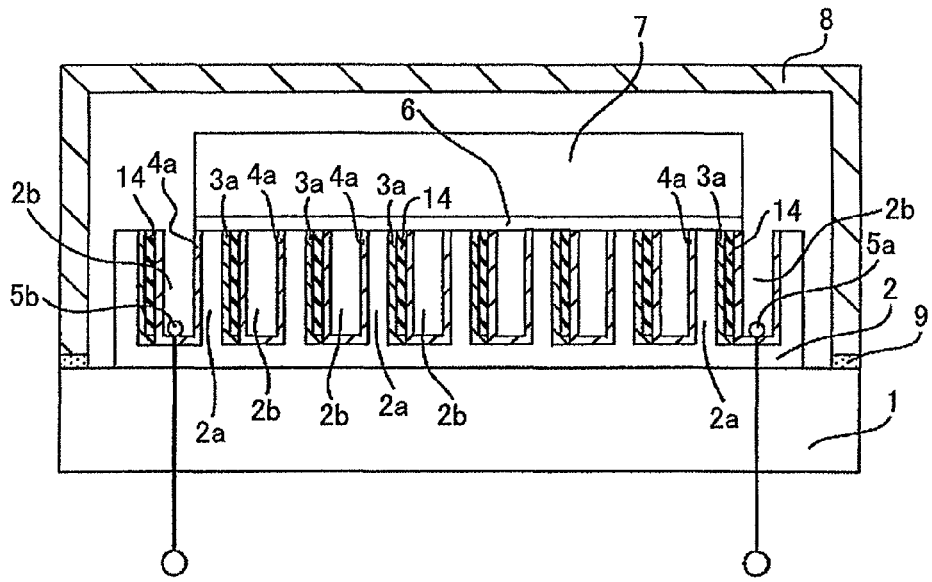
FIG. 10 is a lateral cross-section of a piezoelectric generating apparatus according to a seventh embodiment.

FIG. 10 is a cross-section of a piezoelectric generating apparatus according to a seventh embodiment.

In FIG. 10, as in the first embodiment, the piezoelectric substrate 2 is formed on the substrate 1. In the upper part of the piezoelectric substrate 2, the plate-shaped unimorph piezoelectric cells 2a arranged at intervals via the grooved gaps 2b are formed.

The root portions of the unimorph piezoelectric cells 2a are fixed to the lower part of the piezoelectric substrate 2, i.e., the piezoelectric support portion. The unimorph piezoelectric cells 2a include free ends on the upper side, and generate surface charges in accordance with a pressure applied to the free ends in the lateral direction. While FIG. 10 illustrates seven unimorph piezoelectric cells 2a, the number of the cells 2a is not particularly limited.

On one side of the unimorph piezoelectric cells 2a, the first surface electrode 3a and an insulating film 14 are successively formed. On the other side of the unimorph piezoelectric cells 2a, the second surface electrode 4a is formed. The second surface electrode 4a extends via the bottom surface of the gap 2b onto the one side of the adjacent unimorph piezoelectric cell 2a, thus forming a substantially U shape.

The first surface electrodes 3a and the second surface electrodes 4a are electrically connected to each other on the bottom surfaces of the gaps 2b by which the piezoelectric cells 2a are divided.

The first surface electrodes 3a are formed under conditions such that the first surface electrodes 3a are more difficult to deform than the second surface electrodes 4a. In other words, the laminated structure of the first surface electrode 3a, the insulating film 14, and the second surface electrode 4a on the one side of the unimorph piezoelectric cells 2a are formed under conditions such that the laminated structure is less likely to be deformed by an external force than the second surface electrode 4a on the other side.

Thus, the difficulty of deforming the laminated structure on the one side of the unimorph piezoelectric cells 2a may be quantitatively expressed by a sum of P1, P2, and Pa, where P1 is the product of the Young's modulus E1 of the first surface electrode 3a and its thickness T1, P2 is the product of the Young's modulus E2 of the second surface electrode 4a and its thickness T2, and Pa is the product of the Young's modulus Ea of the insulating film 14 and its thickness Ta. The difficulty of deforming the second surface electrode 4a may be expressed by the product P=ET, where E is the Young's modulus of the material of the second surface electrode 4a and T is its thickness.

Examples of electrically conductive material that may be used in the first surface electrodes 3a and the second surface electrodes 4a include the materials used for forming the first and second surface electrodes 3a and 4a according to the first embodiment. Preferably, the material of the insulating film 14 may have a high Young's modulus, such as alumina.

The first and second wires 5a and 5b are electrically connected to the first surface electrode 3a and the second surface electrode 4a, respectively, on either end of the piezoelectric substrate 2 by soldering or wire bonding, for example.

The weight 7 is mounted on the free ends of the unimorph piezoelectric cells 2a via the adhesive layer 6, as in the first embodiment.

On top of the substrate 1, the casing 8 is attached via the sealant 9, which may include an epoxy resin, as in the first embodiment.

In the piezoelectric generating apparatus, when the weight 7 is moved in the lateral direction as in the foregoing embodiments, the unimorph piezoelectric cells 2a are curved in the same direction, as in the first embodiment. As a result, strain is caused in the unimorph piezoelectric cells 2a, and a potential difference corresponding to pressure is generated between the first surface electrodes 3a and the second surface electrodes 4a due to the lateral piezoelectric effect.

Because the first surface electrodes 3a and the second surface electrodes 4a are connected on the bottom surfaces of the gaps 2b, the unimorph piezoelectric cells 2a are connected in series via the first and second surface electrodes 3a and 4a.

The strength of the first surface electrodes 3a is increased by the insulating film 14 and the second surface electrode 4a laminated thereon. Thus, the strength of the one side of the unimorph piezoelectric cells 2a can be easily adjusted.

The first and second surface electrodes 3a and 4a and the insulating film 14 may be formed as follows.

After the unimorph piezoelectric cells 2a and the gaps 2b are formed in the piezoelectric substrate 2, as illustrated in FIG. 3B for the first embodiment, a first conductive film 15 is formed on both sides of the plate-shaped unimorph piezoelectric cells 2a by sputtering, for example. The thickness of the first conductive film 15 is such that the gaps 2b are not filled.

Thereafter, the insulating film 14 of alumina, for example, having a thickness such that the gaps 2b are completely filled is formed on the first conductive film 15.

Figure 11A:
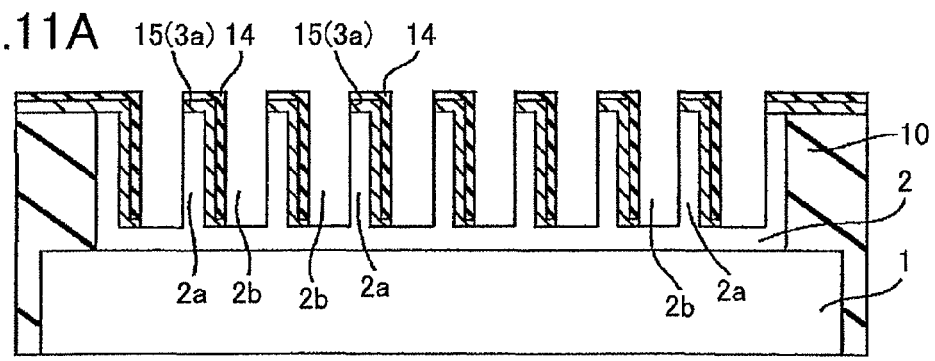
FIGS. 11A and 11B are lateral cross-sections of the piezoelectric generating apparatus according to the seventh embodiment.

Further, as illustrated in FIG. 11A, the gaps 2b are again formed in the insulating film 14 by using a dicing saw, for example, such that a thin layer of the insulating film 14 remains on one side of the unimorph piezoelectric cells 2a, while the other side of the piezoelectric cells 2a is exposed.

Figure 11B:
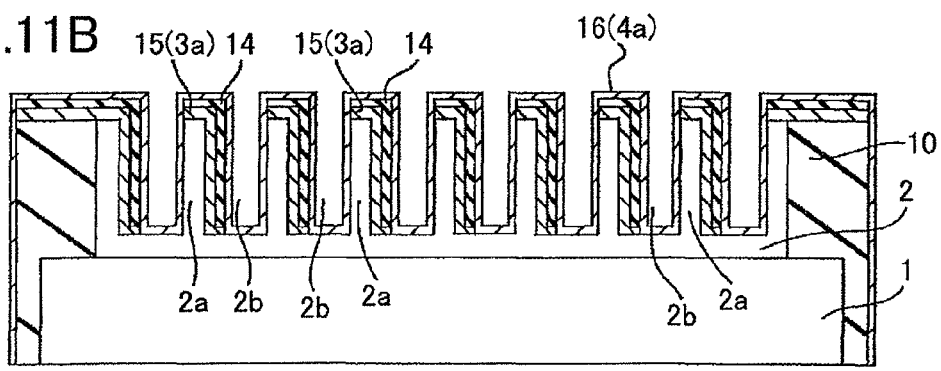

Then, as illustrated in FIG. 11B, a second conductive film 16 is formed on the exposed surfaces of the unimorph piezoelectric cells 2a and the insulating film 14 by sputtering, for example.

The first and second conductive films 15 and 16 and the insulating film 14 are then polished to expose the free ends of the unimorph piezoelectric cells 2a. In this way, the first and second conductive films 15 and 16 are separated from each other via the tops of the unimorph piezoelectric cells 2a, whereby the first and second surface electrodes 3a and 4a illustrated in FIG. 10 are formed. The first surface electrode 3a through the second surface electrode 4a on one side substantially correspond to the first surface electrode according to the first embodiment.

Thus, the difficulty of deformation of the electrode of the laminated structure having two or more layers may be quantitatively expressed by a sum of the products of the Young's modulus and a thickness of each layer of the laminated structure.

While in the first through seventh embodiments the piezoelectric cells are made of the same material, they may be made of different materials and disposed at intervals on the substrate.

[h] Eighth Embodiment

Figure 12:
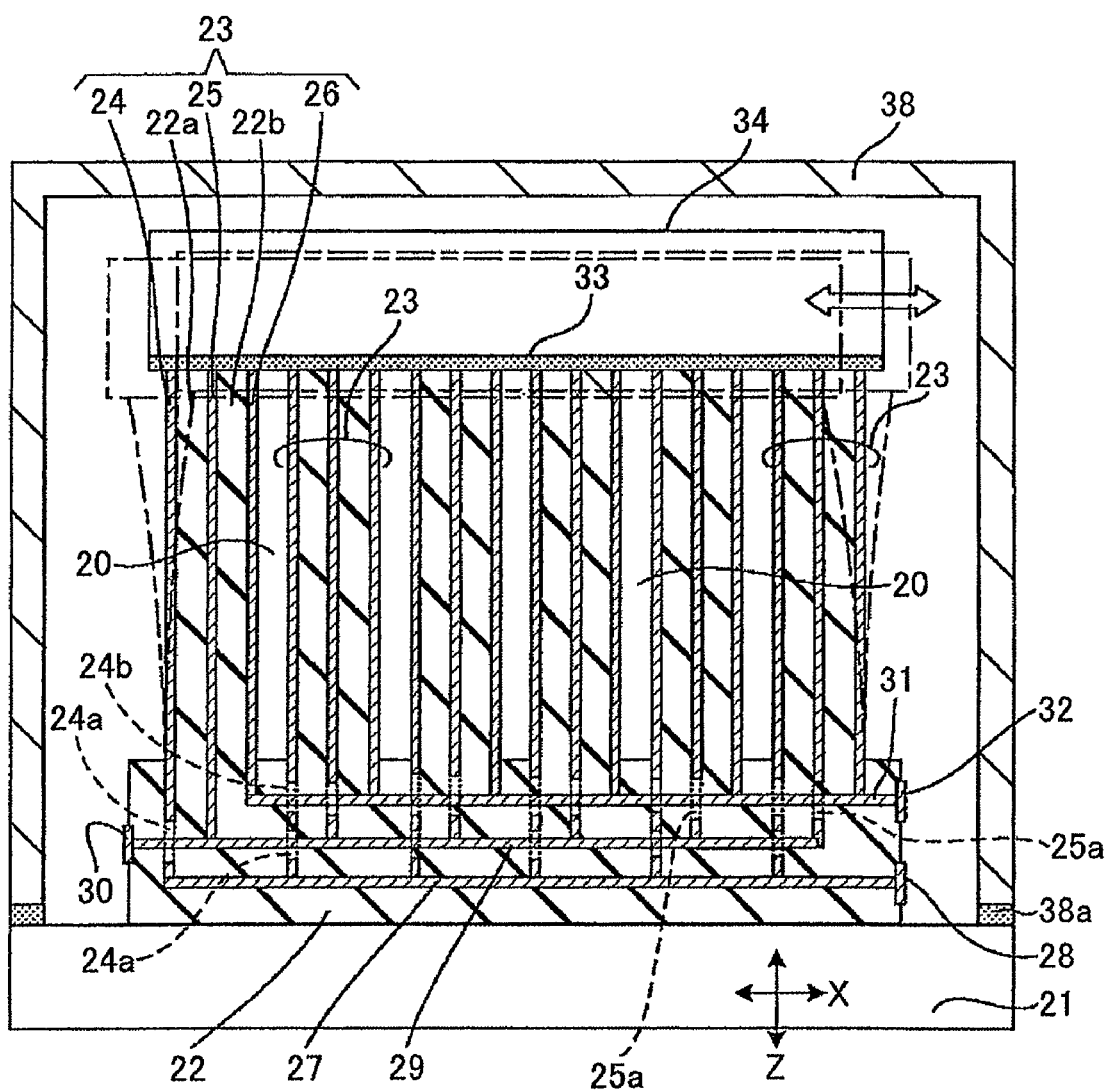
FIG. 12 is a lateral cross-section of a piezoelectric generating apparatus according to an eighth embodiment.
Figure 13:
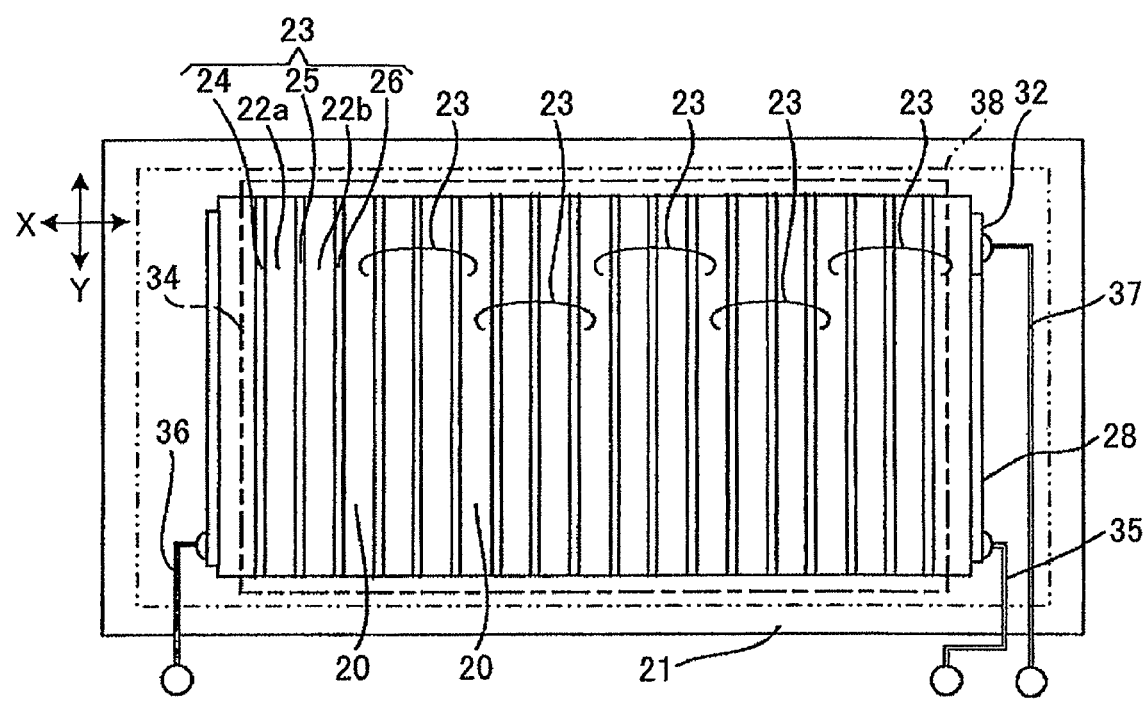
FIG. 13 is a plan view of the piezoelectric generating apparatus from which a casing has been removed according to the eighth embodiment.

FIG. 12 is a cross-section of a piezoelectric generating apparatus according to an eighth embodiment. FIG. 13 is a plan view of the inside of the piezoelectric generating apparatus of FIG. 12.

In FIGS. 12 and 13, the piezoelectric substrate 22 is mounted on the substrate 21 made of a high-strength material, such as alumina, stainless steel, or FRP. The material of the piezoelectric substrate 22 may be selected from the examples of the material of the piezoelectric substrate 2 according to the first embodiment, or other piezoelectric materials may be used.

In an upper part of the piezoelectric substrate 22, a plurality of plate-shaped bimorph piezoelectric cells 23 are formed in a row at intervals via grooved gaps 20. The bimorph piezoelectric cells 23 are extended in a substantially vertical direction on the upper surface of the substrate 22. Root portions of the bimorph piezoelectric cells 23 are fixed to a lower part of the piezoelectric substrate 22. Upper ends of the bimorph piezoelectric cells 23 form free ends. The gaps 20 of the bimorph piezoelectric cells 23 may be about 50 μm.

Thus, the bimorph piezoelectric cells 23 are curved depending on the magnitude of the force applied to their free ends, and the curving causes electric charges to appear on both sides of the bimorph piezoelectric cells 23. While FIG. 12 illustrates six bimorph piezoelectric cells 23, the number of the bimorph piezoelectric cells 23 is not particularly limited.

The bimorph piezoelectric cells 23 each include a first piezoelectric layer 22a and a second piezoelectric layer 22b. Between the first and second piezoelectric layers 22a and 22b, an internal electrode 25 is disposed. A first surface electrode 24 and a second surface electrode 26 are formed on the two surfaces of the first and second piezoelectric layers 22a and 22b, respectively, that are not joined to the internal electrode 25. The first and second piezoelectric layers 22a and 22b may be made of the same material as that of the piezoelectric substrate 21 and may have a thickness of about 50 μm.

The first surface electrodes 24 are connected to a first wire 27 formed in the lower part of the piezoelectric substrate 22. The first wire 27 is formed substantially in parallel with an upper surface of the substrate 21 and connected to a first terminal 28 on a side surface of the piezoelectric substrate 22. The first wire is not connected to either the internal electrodes 25 or the second surface electrodes 26.

The internal electrodes 25 are connected to a second wire 29 formed in the lower part of the piezoelectric substrate 22. The second wire 29 is formed above and in parallel with the first wire 27, and is connected to a second terminal 30 on another side surface of the piezoelectric substrate 22. The second wire 29 is not connected to either the first surface electrodes 24 or the second surface electrodes 26. The second wire 29 may be passed through first holes 24a of the first surface electrodes 24 in a contactless manner, or passed around the first surface electrodes 24.

The second surface electrodes 26 are connected to a third wire 31 formed in the lower part of the piezoelectric substrate 22. The third wire 31 is formed above and in parallel with the second wire 29 and connected to a third terminal 32 on a side surface of the piezoelectric substrate 22. The third wire 31 is not connected to either the first surface electrodes 24 or the internal electrodes 25. The third wire 31 may be passed through second and third holes 24b and 25a of the first surface electrodes 24 and the internal electrodes 25, respectively, in a contactless manner, or passed around the first surface electrodes and the internal electrodes 25.

The internal electrodes 25, the first and second surface electrodes 24 and 26, the first, the second, and the third wires 27, 29, and 31, and the first, the second, and the third terminals 28, 30, and 32 may be made of any electrically conductive material. Preferably, they may be made of different electrically conductive materials.

Preferably, when the piezoelectric substrate 22 is made of a ceramics material, the aforementioned electrodes, wires, and terminals may be made of an electrically conductive material that can be fired simultaneously with the ceramics material. Examples of such electrically conductive material include Pt, Ni, palladium (Pd), and silver palladium (AgPd).

Preferably, the first and second surface electrodes 24 and 25 may be formed by the same method as for the first surface electrodes 3 and 3a and the second surface electrodes 4 and 4a as described with reference to the first through the seventh embodiments after firing the ceramics material.

On top of the free ends of the bimorph piezoelectric cells 23, a weight 34 is attached via an adhesive layer 33. The weight 34 has a shape such that the free ends can be connected. The weight 34 may include a single solid body or a plurality of solid portions. Preferably, the weight is made of a material having a high specific gravity and a high Young's modulus, such as the same materials of the weight 7 described with reference to the first embodiment. The weight 34 may be made of a piezoelectric material and formed integrally with the first and second piezoelectric layers 22a and 22b. In this case, the adhesive layer 33 may be omitted.

Preferably, the adhesive layer 33 is made of a material capable of preventing the peeling of the weight 34 from the bimorph piezoelectric cell 23 upon deformation of the bimorph piezoelectric cells 23, while not preventing the deformation of the bimorph piezoelectric cells 23. The adhesive layer 33 may be made of a material having a Young's modulus smaller than that of the first and second piezoelectric layers 22a and 22b, such as a silicone elastic resin.

A casing 38 is attached on the substrate 21. The casing 38 provides a space for housing the piezoelectric substrate 22 and the weight 34, the space large enough that the bimorph piezoelectric cells 23 and the weight 34 can be freely deformed within it. A peripheral rim of a lower opening portion of the casing 38 is bonded to a peripheral edge portion on an upper surface of the substrate 21 via a sealant 38a, which may include an epoxy resin. The casing 38 may be made of stainless steel, aluminum, or a resin.

Between the casing 38 and the substrate 21, gaps may be provided for passing first, second, and third draw-out wires 35, 36, and 37 from within the casing 38 to the outside. The first, second, and third draw-out wires 35, 36, and 37 are connected to the first, the second, and the third terminals 28, 30, and 32, respectively.

While not illustrated in the drawings, the internal electrodes 25, the first surface electrodes 24, and the second surface electrodes 26 may be respectively connected outside the piezoelectric substrate 22 via wires without forming the third wires 27, 29, and 31 within the piezoelectric substrate 22.

A bimorph piezoelectric body may include a "same direction type" in which the first and second piezoelectric layers 22a and 22b have the same direction of polarization, and an "opposite direction type" in which the first and second piezoelectric layers 22a and 22b have opposite directions of polarization. While basically either method may be adopted, the following description is based on the opposite direction type.

In the foregoing embodiment, first the first terminal 28 and the third terminal 32 are electrically connected, and then a DC voltage is applied between the terminals 28 and 32 and the second terminal 30. In this way, electric fields are generated between the first surface electrodes 24 and the internal electrodes 25 and between the second surface electrodes 26 and the internal electrodes 25. As a result, the first piezoelectric layers 22a are polarized in a first direction, and the second piezoelectric layers 22b are polarized in a direction opposite to the first direction.

Thereafter, the DC voltage is separated from the first through the third terminals 28, 30, and 32. Even after the separation, the polarizations of the first and second piezoelectric layers 22a and 22b are maintained. This is because the first and second piezoelectric layers 22a and 22b are made of a piezoelectric material as described above and therefore have ferroelectric property.

Next, when a vibration having a component in a direction parallel to the upper surface of the substrate 21 is applied to the piezoelectric generating apparatus illustrated in FIGS. 12 and 13, the weight 34 is vibrated. As a result, the bimorph piezoelectric cells 23 formed on the piezoelectric substrate 22 are curved in accordance with the vibration of the weight 34.

Specifically, either the first piezoelectric layers 22a or the second piezoelectric layers 22b of the bimorph piezoelectric cells 23 are extended while the other are compressed. As a result, strain is caused in each of the first piezoelectric layers 22a and the second piezoelectric layers 22b. A resultant voltage has a value corresponding to the acceleration of the weight 34 due to the lateral piezoelectric effect (d31 effect).

An electric power generated by the bimorph piezoelectric cells 23 is guided from the first and second surface electrodes 24 and 26 to the first and second terminals 28 and 32, respectively, via the first and the third wires 27 and 31, respectively.

In each of the bimorph piezoelectric cells 23, the voltage between the first surface electrode 24 and the second surface electrode 26 corresponds to a sum of a voltage generated on both sides of the first piezoelectric layer 22a and a voltage generated on both sides of the second piezoelectric layer 22b.

The electric power generated by the bimorph piezoelectric cells 23 is guided to the first and the third terminals 28 and 32 via the first and the third wires 27 and 31, respectively, and further drawn out to the outside via the first and the third draw-out wires 35 and 37.

Thus, in accordance with the present embodiment, the weight 34 is bonded in such a manner as to span the free ends of the bimorph piezoelectric cells 23, so that charges of corresponding polarities can be generated on the sides of the bimorph piezoelectric cells 23. Further, the bimorph piezoelectric cells 23 are connected in parallel with each other via the first and third wires 27 and 31, so that the charges generated on both sides of the bimorph piezoelectric cells 23 can be added up and delivered via the first and third terminals 28 and 32.

In an acceleration test, the piezoelectric generating apparatus having ten bimorph piezoelectric cells 23 may be vibrated by using a vibrator. In this case, the bimorph piezoelectric cells 23 may have a height of about 5 mm, a width of about 5 mm, and a thickness of about 115 µm.

When the vibrating frequency of the weight 34 is set at 1 kHz, a high power of about 20 mW may be output via the first terminal 28 and the third terminal 32.

On the other hand, in the case of the piezoelectric generating apparatus according to the related art illustrated in FIG. 4, when the vibrating frequency in the up-down direction is 1 kHz, a low power of about 40 µW is output.

When the piezoelectric generating apparatus illustrated in FIG. 12 is of the same direction type, first a DC voltage is applied between the first terminal 28 and the second terminal 30 in order to generate an electric field between the first surface electrodes 24 and the internal electrodes 25. Similarly, a DC voltage is applied between the second terminal 30 and the third terminal 32 in order to generate an electric field between the internal electrodes 24 and the second surface electrodes 26.

As a result, the first piezoelectric layers 22a are polarized in a first direction while the second piezoelectric layers 22b are polarized in the same direction as the first direction.

In the same direction type, as opposed to the opposite direction type, when each of the bimorph piezoelectric cells 23 is curved, the first surface electrode 24 and the second surface electrode 26 generate potentials of the same polarity with respect to the internal electrode 25. Thus, the first terminal 28 and the second terminal 32 are electrically connected and an output is obtained between the terminals 28 and 32 and the third terminal 30. In this case, the output voltage is one half that in the case of the opposite direction type but the current is increased two folds, so that the total output power is not particularly changed.

Next, a method of forming the piezoelectric generating apparatus is described.

Figure 14A:
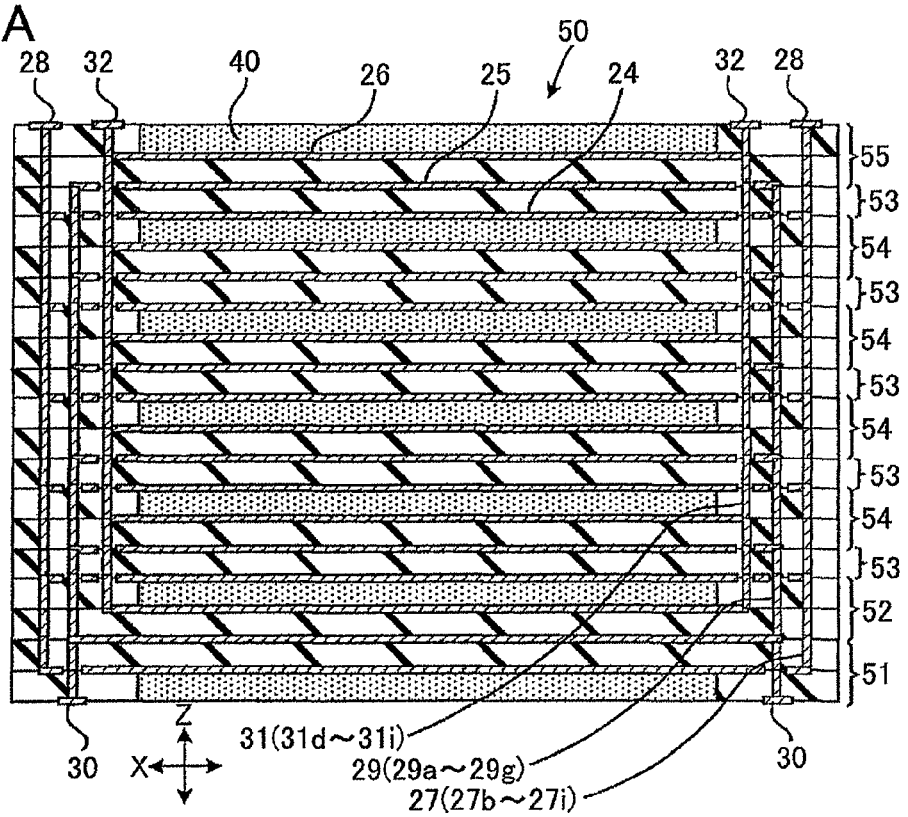
FIGS. 14A and 14B are cross-sections illustrating steps of forming piezoelectric bodies included in the piezoelectric generating apparatus according to the eighth embodiment.

First, a green sheet laminated block 50 illustrated in FIG. 14A is formed. The green sheet laminated block 50 may be formed by laminating first through fifth green sheet laminated units 51 through 55 having the same planar shape, as illustrated in FIGS. 15A through 15E.

The first through fifth green sheet laminated units 51 through 55 have a rectangular planar shape and a symmetrical structure with respect to a left-right direction. Regarding the rectangular shape, the length of the two sides in a length direction (x direction) may be twice the height of the piezoelectric substrate 22 including the bimorph piezoelectric cells 23. The two sides in a direction (y direction) perpendicular to the length direction may have the same length as the width of the bimorph piezoelectric cells 23.

On top of the first green sheet laminated unit 51, the second green sheet laminated unit 52 and the third green sheet laminated unit 53 are successively stacked. Further, on top of the third green sheet laminated unit 53, four layers of the fourth green sheet laminated units 54 and four layers of the third green sheet laminated units 53 are laminated alternately. Further, on top of the upper-most third green sheet laminated unit 53, the fifth green sheet laminated unit 55 is stacked.

Figure 15A:
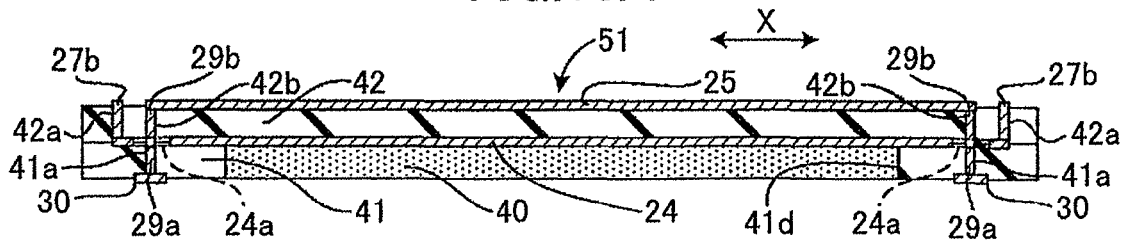
FIGS. 15A through 15E are cross-sections of five green sheet laminated units for forming the piezoelectric bodies included in the piezoelectric generating apparatus according to the eighth embodiment.

The first green sheet laminated unit 51, as illustrated in FIG. 15A, has a structure in which a second green sheet 42 is laminated on a first green sheet 41.

The first green sheet 41 has a wide groove 41d of a shape corresponding to two of the grooved gaps 20 illustrated in FIG. 12 connected in the height direction. The groove 41d is filled with a resin paste 40 which may include an acrylic resin. In the first green sheet 41, the first surface electrode 24 is formed on top of and at the sides of the resin paste 40. At the sides of the groove 41d, first via holes 41a that penetrate first holes 24a formed in the first surface electrode 24 are formed. The first via holes 41a are filled with first electrically conductive plugs 29a.

On a lower surface of the first green sheet 41, second terminals 30 connected to the lower ends of the first electrically conductive plugs 29a are formed.

The second green sheet 42 has second via holes 42a connected to the ends of the first surface electrode 24 on the first green sheet 41 and third via holes 42b directly connected to the first via holes 41a. The second and the third via holes 42a and 42b are filled with second and third electrically conductive plugs 27b and 29b, respectively. On top of the second green sheet 42, the internal electrode 25 is formed. The ends of the internal electrode 25 are connected to the upper ends of the third electrically conductive plugs 29b.

The internal electrode 25 has a size such that it does not reach the second electrically conductive plugs 27b further outside the third electrically conductive plugs 29b.

Figure 15B:
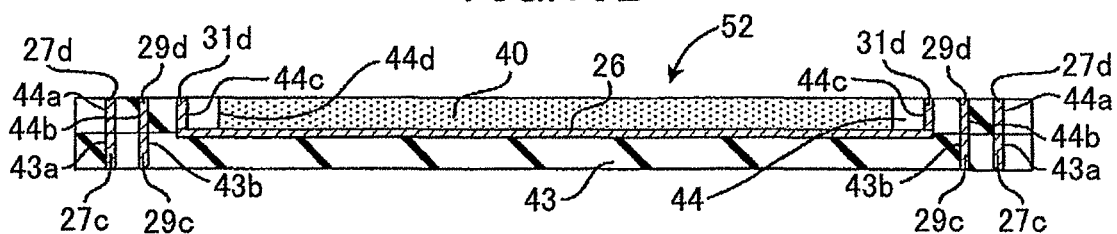

The second green sheet laminated unit 52 has a structure in which a fourth green sheet 44 is stacked on a third green sheet 43, as illustrated in FIG. 15B.

In the side areas of the third green sheet 43, fourth via holes 43a and fifth via holes 43b are formed. The fourth via holes 43a and the fourth via holes 43b are configured to be laid over the second electrically conductive plugs 27b and the third electrically conductive plugs 29b, respectively, of the second green sheet 42 illustrated in FIG. 14A. In the fourth and the fifth via holes 43a and 43b, fourth and fifth electrically conductive plugs 27c and 29c, respectively, are formed. Further, the second surface electrode 26 is formed on an upper surface of the third green sheet 43 in an area between the two fifth electrically conductive plugs 29c at the ends. The second surface electrode 26 is not in contact with the fifth electrically conductive plugs 29c.

The fourth green sheet 44 has a groove 44d corresponding to the groove 41d of the first green sheet 41 in shape and position. The groove 44d is filled with the resin paste 40. In the fourth green sheet 44, at both sides of the groove 44d, sixth via holes 44a connected to the fourth electrically conductive plugs 27c and seventh via holes 44b connected to the fifth electrically conductive plugs 29c are formed. At both sides of the groove 44d, eighth via holes 44c are formed over the ends of the second surface electrode 26 on the third green sheet 43. The sixth, the seventh, and the eighth via holes 44a, 44b, and 44c are filled with sixth, seventh, and eighth electrically conductive plugs 27d, 29d, and 31d, respectively.

Figure 15C:
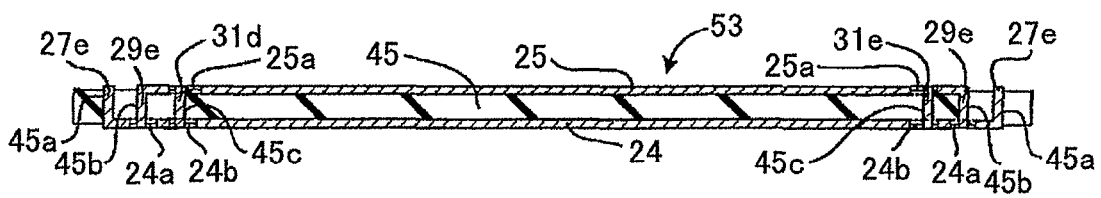

As illustrated in FIG. 15C, the third green sheet laminated unit 53 includes a fifth green sheet 45. On a lower surface of the fifth green sheet 45, the first surface electrode 24 is formed. On an upper surface of the fifth green sheet 45, the internal electrode 25 is formed. In areas at the ends of the fifth green sheet 45, there are formed ninth, tenth, and eleventh via holes 45a, 45b, and 45c to be laid over the sixth, the seventh, and the eighth electrically conductive plugs 27d, 29d, and 31d, respectively, of the fourth green sheet illustrated in FIG. 15B. The ninth, the tenth, and the eleventh via holes 45a, 45b, and 45c are filled with ninth, tenth, and eleventh electrically conductive plugs 27e, 29e, and 31e, respectively. The ninth electrically conductive plugs 27e are connected to the ends of the first surface electrode 24 on the lower surface of the fifth green sheet 45. The tenth electrically conductive plugs 29e are connected to the ends of the internal electrode 25 on the upper surface of the fifth green sheet 45.

In the first surface electrode 24 on the surface of the fifth green sheet 45, first and second holes 24a and 24b are formed through which the tenth and the eleventh electrically conductive plugs 29e and 31e are passed. In the internal electrode 25 on the surface of the fifth green sheet 45, third holes 25a are formed through which the eleventh electrically conductive plugs 31e are passed.

Figure 15D:
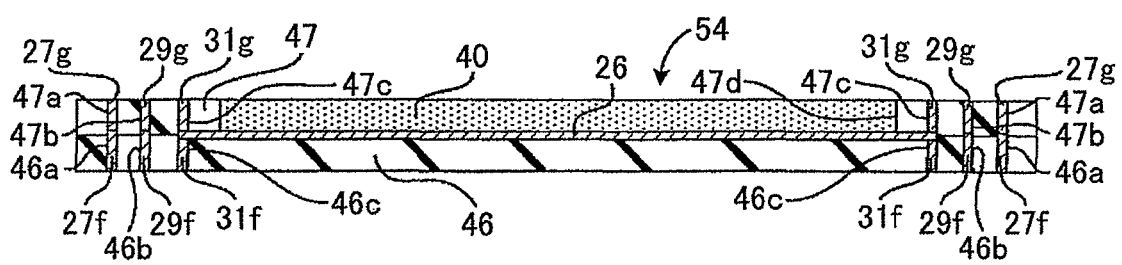

As illustrated in FIG. 15D, the fourth green sheet laminated unit 54 has a structure in which a seventh green sheet 47 is laid over a sixth green sheet 46.

In the side areas of the sixth green sheet 46, there are formed twelfth, thirteenth, and fourteenth via holes 46a, 46b, and 46c to be laid over the ninth, the tenth, and the eleventh electrically conductive plugs 27e, 29e, and 31e, respectively, of the fifth green sheet 45 illustrated in FIG. 15C. In the twelfth, the thirteenth, and the fourteenth via holes 46a, 46b, and 46c, twelfth, thirteenth, and fourteenth electrically conductive plugs 27f, 29f, and 31f, respectively, are formed. Further, the second surface electrode 26 is formed on an upper surface of the sixth green sheet 46. Ends of the second surface electrode 26 are connected to the fourteenth electrically conductive plugs 31f.

The seventh green sheet 47 includes a groove 47d corresponding to the groove 41d of the first green sheet 41 in shape and position. The groove 47d is filled with a resin paste 40. In the seventh green sheet 47, fifteenth, sixteenth, and seventeenth via holes 47a, 47b, and 47c connected to the twelfth, the thirteenth, and the fourteenth electrically conductive plugs 27f, 29f, and 31f, respectively, are formed on both sides of the groove 47d. In the fifteenth, the sixteenth, and the seventeenth via holes 47a, 47b, and 47c, fifteenth, sixteenth, and seventeenth electrically conductive plugs 27g, 29g, and 31g, respectively, are formed.

Figure 15E:
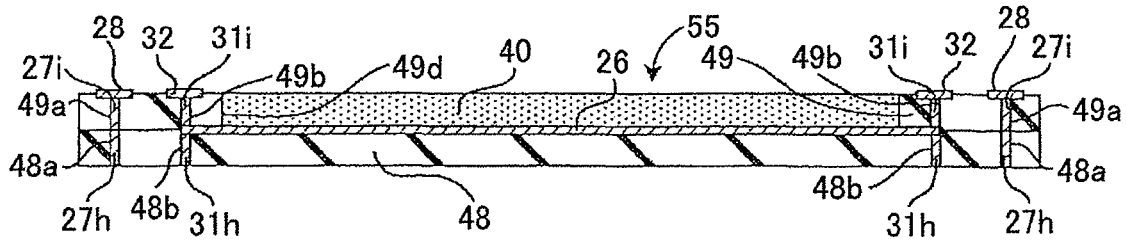

As illustrated in FIG. 15E, the fifth green sheet laminated unit 55 has a structure in which a ninth green sheet 49 is laid over an eighth green sheet 48.

In the side areas of the eighth green sheet 48, there are formed eighteenth and nineteenth via holes 48a and 48b to be laid over the ninth and the eleventh electrically conductive plugs 27e and 31e, respectively, in the fifth green sheet 45 illustrated in FIG. 15C. In the eighteenth and nineteenth via holes 48a and 48b, eighteenth and nineteenth electrically conductive plugs 27h and 31h, respectively, are formed. Further, the second surface electrode 26 is formed on an upper surface of the eighth green sheet 48, the ends of the second surface electrode 26 being connected to the nineteenth electrically conductive plugs 31h.

The ninth green sheet 49 includes a groove 49d corresponding to the groove 41d of the first green sheet 41 in shape and position. The grove 49d is filled with a resin paste 40. In the seventh green sheet 49, twentieth and twenty-first via holes 49a and 49b connected to the eighteenth and the nineteenth electrically conductive plugs 27h and 31h, respectively, are formed on both sides of the groove 49d. In the twentieth and twenty-first via holes 49a and 49b, twentieth and twenty-first electrically conductive plugs 27i and 31i, respectively, are formed.

On the ninth green sheet 49, the first and third terminals 28 and 32 connected to the twentieth and the twenty-first electrically conductive plugs 27i and 31i, respectively, are formed.

The first through ninth green sheets 41 through 49 may be formed by molding a dispersion of a ceramic material in an organic binder into a sheet. The ceramic material may include the material of the piezoelectric substrate 22, such as a PZT material.

The first through twenty-first electrically conductive plugs 27b through 27i, 29a through 29g, and 30b through 31i may be made of silver palladium. The first surface electrodes 24, the internal electrodes 25, and the second surface electrodes 26 may be made of silver palladium.

The green sheet laminated block 50 may be formed by laminating the first through ninth green sheets 41 through 49, the first surface electrodes 24, and the like successively from below. Alternatively, the first through fifth green sheet laminated units 51 through 55 may be separately formed and then stacked.

The green sheet laminated block 50 may be degreased in the atmosphere and then fired, thereby forming a sintered body of a piezoelectric material. The temperature for degreasing may be about 400° C., and the temperature for firing may be about 1000° C.

Figure 14B:
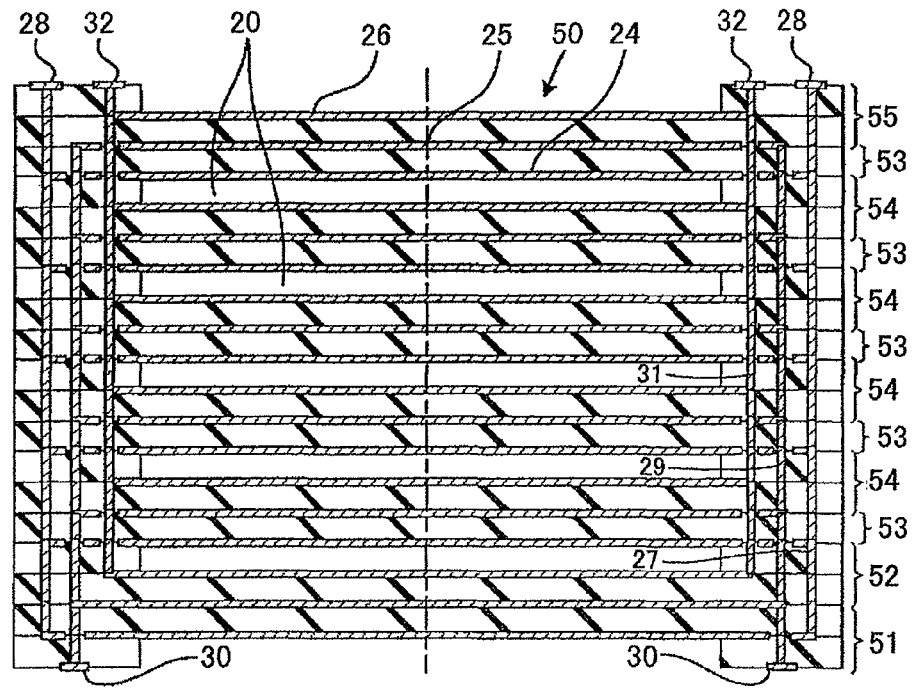

As illustrated in FIG. 14B, the resin paste 40 in the green sheet laminated block 50 is eliminated by being flown apart or burnt by the heating. The areas from which the resin paste 40 has been eliminated form the grooved gaps 20 of the bimorph piezoelectric cells 23.

In the green sheet laminated block 50, the second, the fourth, the sixth, the ninth, the twelfth, the fifteenth, the eighteenth, and the twentieth electrically conductive plugs 27b through 27i are mutually connected to form the first wire 27. The first, the third, the fifth, the seventh, the tenth, the thirteenth, and the sixteenth electrically conductive plugs 29a through 29g are mutually connected to form the second wire 29. Further, the eighth, the eleventh, the fourteenth, the seventeenth, the nineteenth, and the twenty-first electrically conductive plugs 31d through 31i are mutually connected to form the third wire 31.

The sintered green sheet laminated block 50 is cut along a dashed line indicated in FIG. 14B, thus forming two piezoelectric substrates 22 each having the bimorph piezoelectric cells 23 illustrated in FIG. 12.

Thereafter, the weight 34 illustrated in FIG. 12 is bonded to the free ends of the bimorph piezoelectric cells 23 via the adhesive 33.

For example, when the piezoelectric substrate 22 has a height of about 5 mm and the bimorph piezoelectric cells 23 has a width of about 5 mm and a thickness of about 100 µm, the weight 34 of stainless steel with a thickness of about 1 mm is connected to the free ends of the bimorph piezoelectric cells 23.

Then, one end of the first through the third draw-out wires 35, 36, and 37 is connected to the first through third terminals 28, 30, and 32, respectively, and then the other end of the first through third draw-out wires 35, 36, and 37 is drawn out of the substrate 21. Thereafter, the casing 38 of a cubic outer shape is bonded and fixed onto the peripheral edge portions of the substrate 1 via the epoxy resin 38a.

Next, a method of forming the green sheets, the electrodes, and the electrically conductive plugs is described with reference to the fourth green sheet laminated unit 54 as an example.

Figure 16A:
FIGS. 16A through 16E are cross-sections illustrating steps of forming one of the green sheet laminated units included in the piezoelectric generating apparatus according to the eighth embodiment.

First, as illustrated in FIG. 16A, the sixth green sheet 46 with a thickness of 50 µm is formed from a piezoelectric material including a piezoelectric ceramic powder, a binder resin, and a plasticizer by a doctor blade method. The sixth green sheet 46 is cut into a rectangular shape of 10 mm×5 mm, for example.

Figure 16B:
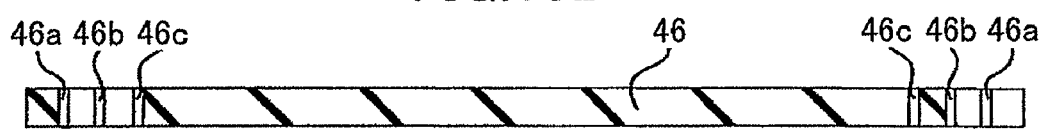

Then, as illustrated in FIG. 16B, the twelfth, the thirteenth, and the fourteenth via holes 46a, 46b, and 46c are punched through in the areas at the ends of the sixth green sheet 46 with respect to the long side as seen in the drawings. The twelfth, the thirteenth, and the fourteenth via holes 46a, 46b, and 46c may have a diameter of about 50 µm.

Figure 16C:

Thereafter, as illustrated in FIG. 16C, the twelfth, the thirteenth, and the fourteenth via holes 46a, 46b, and 46c are filled with an AgPd paste by screen printing.

In this way, the twelfth, the thirteenth, and the fourteenth electrically conductive plugs 27f, 29f, and 31f each containing AgPd are formed in the twelfth, the thirteenth, and the fourteenth via holes 46a, 46b, and 46c, respectively.

Further, the second surface electrode 26 is formed on the sixth green sheet 46 by screen printing the AgPd paste.

Figure 16D:
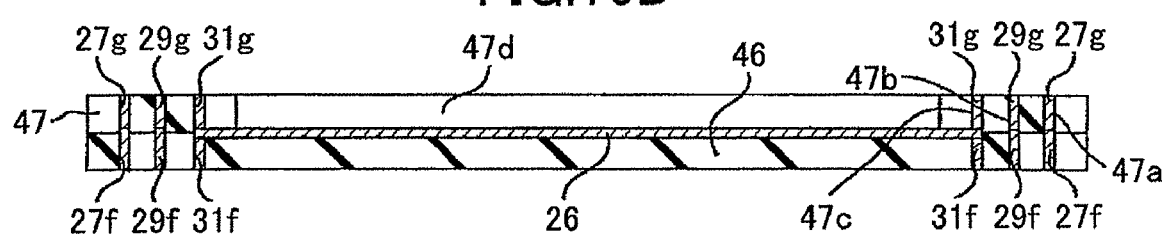

Then, as illustrated in FIG. 16D, the seventh green sheet 47 with the groove 47d formed therein is placed on the sixth green sheet 46. On both sides of the groove 47d in the seventh green sheet 47, the fifteenth, the sixteenth, and the seventeenth via holes 47a, 47b, and 47c are formed by punching.

The fifteenth, the sixteenth, and the seventeenth via holes 47a, 47b, and 47c are filled with the AgPd paste by screen printing. In this way, the fifteenth, the sixteenth, and the seventeenth electrically conductive plugs 27g, 29g, and 31g each containing AgPd are formed in the fifteenth, the sixteenth, and the seventeenth via holes 47a, 47b, and 47c, respectively.

Figure 16E:
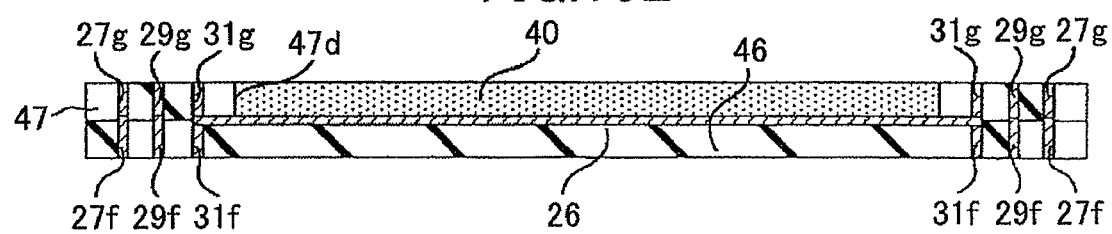

Further, as illustrated in FIG. 16E, the groove 47d is filled with the resin paste 40 of an acrylic material by screen printing.

Thus, the fourth green sheet laminated unit 54 is completed.

For example, each of the first through the ninth green sheets 41 through 49 is cut into a planar shape with a width of 100 mm and a length of 100 mm, and the plane is divided into 10×20 areas. Then, the first through the fifth green sheet laminated units 51 through 55 of the structure illustrated in FIG. 14A are formed in each of the divided areas of the first through the ninth green sheets 41 through 49. In this way, 200 integrated green sheet laminated blocks 50 can be formed. The integrated green sheet laminated blocks 50 may then be sintered, thereby simultaneously forming 400 piezoelectric elements from a single sintered block, thus enabling mass manufacture of the piezoelectric elements.

Preferably, the grooves 47d may be filled with an insulating material having a smaller Young's modulus than that of the bimorph piezoelectric cells 23, as in the fourth or the sixth embodiment.

Figure 17A:
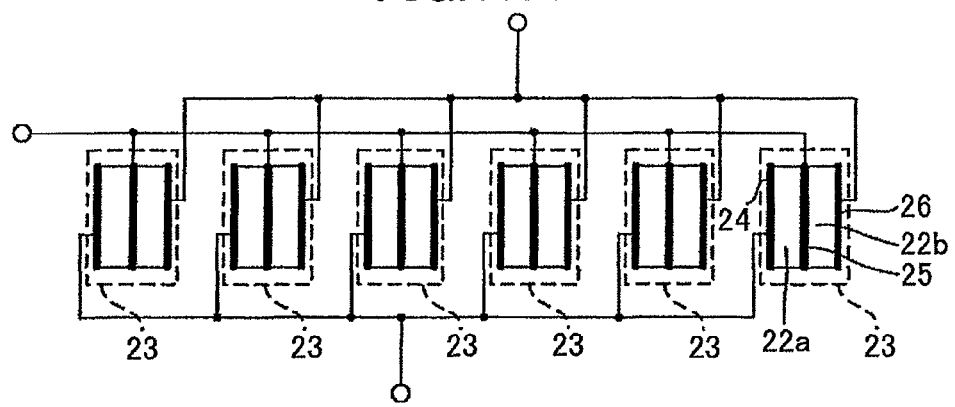
FIGS. 17A and 17B are equivalent circuit diagrams of the piezoelectric generating apparatus according to the eighth embodiment.
Figure 17B:
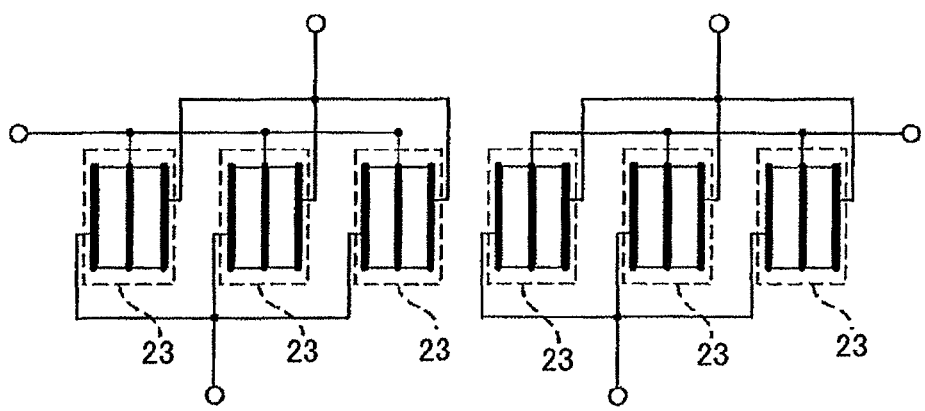

The piezoelectric generating apparatus illustrated in FIG. 12 has the structure in which all of the bimorph piezoelectric cells 23 are connected in parallel, as illustrated by an equivalent circuit of FIG. 17A. Preferably, as illustrated by an equivalent circuit of FIG. 17B, the bimorph piezoelectric cells 23 may be divided into a plurality of groups and connected in parallel on a group by group basis.

The manner of mutual connection of the bimorph piezoelectric cells 23 is not limited to the circuit described above. For example, the bimorph piezoelectric cells 23 are connected in series. The connection may be made via wires within or outside the piezoelectric substrate 22.

Preferably, the piezoelectric generating apparatus according to the eighth embodiment may be internally filled with the resin 13, as in the example illustrated in FIG. 7. The substrate 21 may be omitted and the piezoelectric generating substrate 22 may be configured to provide the function of the substrate 21, as in the example illustrated in FIG. 8. Further, in the piezoelectric generating apparatus illustrated in FIG. 12, the tips of the bimorph piezoelectric cells 23 may be fixed to the substrate 21, thus forming fixed ends, and the portion of the piezoelectric substrate 22 in which the wires 27, 29, and 31 are formed may be used as the weight.

Figure 18:
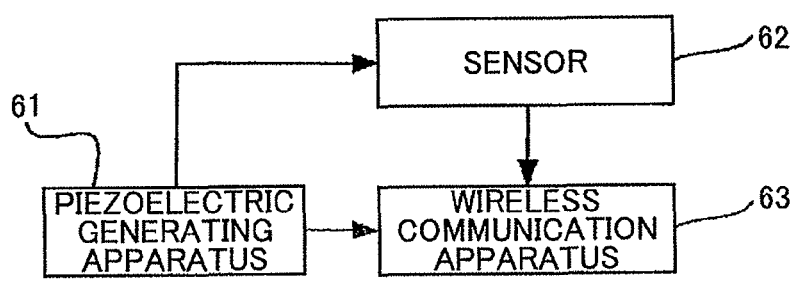
FIG. 18 is a block diagram of an apparatus in which the piezoelectric generating apparatus according to an embodiment is applied.

As illustrated in FIG. 18, a piezoelectric generating apparatus 61 having the structure according to any of the various embodiments may be used within or connected to a wireless communication apparatus 63 with a sensor 62 and a data processing function. The piezoelectric generating apparatus 61 may be connected to another apparatus. The sensor 61 is not particularly limited and may include a sensor for detecting gas, temperature, humidity, or luminance.

A piezoelectric apparatus having the structure according to any of the embodiments may be installed at a location where vibrations are generated.

While the piezoelectric cells are arranged in a row at intervals in the foregoing embodiments, a plurality of rows of the piezoelectric cells may be formed.

Thus, in accordance with an embodiment, a weight is connected to free ends of a plurality of piezoelectric bodies forming piezoelectric generating units of a piezoelectric generating apparatus, so that the number of piezoelectric generating units per volume of the piezoelectric generating apparatus can be increased and an enhanced power generating efficiency can be obtained. Further, the plurality of piezoelectric generating units can be connected in series or parallel within a short distance, so that a large power can be generated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present disclosure have been described in detail, it should be understood that various changes, substitutions, and alterations could be made hereto without departing from the spirit and scope of the invention.

What is claimed is:

1. A piezoelectric generating apparatus comprising:
   a plurality of piezoelectric bodies arranged at intervals via a gap, each of the plurality of piezoelectric bodies having a fixed end and a free end;
   a first surface electrode formed on one side of each of the plurality of piezoelectric bodies;
   a second surface electrode formed on another side of each of the plurality of piezoelectric bodies;
   a weight spanning the plurality of piezoelectric bodies and attached to the free end of each the plurality of piezoelectric bodies; and
   a support portion having a surface, defined by a single plane, to which the fixed end of each of the plurality of piezoelectric bodies is fixed.

2. The piezoelectric generating apparatus according to claim 1, wherein a product of a first Young's modulus of the first surface electrode and a first thickness of the first surface electrode in a direction from the one side to the other side is greater than a product of a second Young's modulus of the second surface electrode and a second thickness of the second surface electrode in a direction from the one side to the other side.

3. The piezoelectric generating apparatus according to claim 2, wherein the first thickness is greater than the second thickness.

4. The piezoelectric generating apparatus according to claim 2, wherein the plurality of piezoelectric bodies are made of a piezoelectric material that generates a potential difference between the first surface electrode and the second surface electrode due to a lateral piezoelectric effect caused by a change in a relative position of the weight with respect to the fixed ends.

5. The piezoelectric generating apparatus according to claim 1, wherein the fixed ends of the plurality of piezoelectric bodies are integrally formed on the support portion.

6. The piezoelectric generating apparatus according to claim 1, wherein the first surface electrode and the second surface electrode that are adjacent to each other via the gap are connected on the surface of the support portion.

7. The piezoelectric generating apparatus according to claim 1, wherein the weight is bonded to the free ends via an adhesive layer having a Young's modulus smaller than that of the plurality of piezoelectric bodies.

8. The piezoelectric generating apparatus according to claim 1, wherein the plurality of piezoelectric bodies include
a first piezoelectric layer,
a second piezoelectric layer, and
an internal electrode disposed between the first piezoelectric layer and the second piezoelectric layer.

9. The piezoelectric generating apparatus according to claim 8, wherein the first piezoelectric layer and the second piezoelectric layer are made of a piezoelectric material that generates a potential difference between the first electrode and the internal electrode and between the second electrode and the internal electrode due to a lateral piezoelectric effect caused by a change in position of the weight with respect to the fixed ends.

10. The piezoelectric generating apparatus according to claim 9, wherein the first piezoelectric layer and the second piezoelectric layer have directions of polarization that are adjusted to be opposite relative to each other in an initial state.

11. The piezoelectric generating apparatus according to claim 9, wherein the first piezoelectric layer and the second piezoelectric layer have directions of polarization that are adjusted to be the same relative to each other in an initial state.

12. The piezoelectric generating apparatus according to claim 9, wherein the fixed ends of the plurality of piezoelectric bodies are integrally formed on the support portion.

13. The piezoelectric generating apparatus according to claim 12, wherein the support portion includes therein a first wire coupling a plurality of the first surface electrodes, a second wire coupling a plurality of the internal electrodes, and a third wire coupling a plurality of the second surface electrodes.

14. The piezoelectric generating apparatus according to claim 13, wherein the support portion includes a surface formed with a first terminal coupled to the first wire, a second terminal coupled to the second wire, and a third terminal coupled to the third wire.

15. The piezoelectric generating apparatus according to claim 5, wherein the plurality of piezoelectric bodies and the support portion form a single sintered body.

16. The piezoelectric generating apparatus according to claim 1, wherein the gap is filled with an insulating material having a Young's modulus smaller than that of the plurality of piezoelectric bodies.

17. The piezoelectric generating apparatus according to claim 1, wherein the weight is made of a piezoelectric material and is formed integrally on the free ends of the plurality of piezoelectric bodies.

* * * * *